(12) United States Patent  
Maitani et al.

(10) Patent No.: US 8,029,660 B2
(45) Date of Patent: Oct. 4, 2011

(54) MANUFACTURING METHOD OF SEMICONDUCTOR INTEGRATED DEVICE WITH INVERTING PLATING CUP

(75) Inventors: Tota Maitani, Tokyo (JP); Taku Kanaoka, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 363 days.

(21) Appl. No.: 12/256,565

(22) Filed: Oct. 23, 2008

(65) Prior Publication Data

US 2009/0117730 A1 May 7, 2009

(30) Foreign Application Priority Data

Nov. 2, 2007 (JP) .................................. 2007-285969

(51) Int. Cl.
C25D 21/10 (2006.01)
C25D 7/12 (2006.01)

(52) U.S. Cl. ........ 205/148; 205/137; 205/143; 205/145; 205/157; 204/212; 204/213; 204/214; 204/273

(58) Field of Classification Search .................. 205/157, 205/148; 204/212, 213, 214, 273
See application file for complete search history.

(56) References Cited

U.S. PATENT DOCUMENTS

| 6,875,333 B2 * | 4/2005 | Sakaki | 205/148 |
| 7,108,776 B2 * | 9/2006 | Sakaki | 205/157 |
| 2005/0000814 A1 * | 1/2005 | Metzger | 205/69 |
| 2008/0045035 A1 * | 2/2008 | Lee et al. | 438/754 |

FOREIGN PATENT DOCUMENTS

| JP | 08-311699 A | | 11/1996 |
| JP | 2004-197228 A | | 7/2004 |
| JP | 2004197228 A | * | 7/2004 |
| JP | 2006-022379 A | | 1/2006 |
| JP | 2006022379 A | * | 1/2006 |

* cited by examiner

Primary Examiner — N Drew Richards
Assistant Examiner — John P Dulka
(74) Attorney, Agent, or Firm — Miles & Stockbridge P.C.

(57) ABSTRACT

Manufacture of semiconductor products such as LCD driver requires a bump plating step for forming a gold bump electrode having a size of from about 15 to 20 μm. This bump plating step is performed by electroplating with a predetermined plating solution, but projections intermittently appear on the bump electrode during a mass production process. In the invention, abnormal growth of projections over the gold bump electrode is prevented by adding, prior to the gold bump plating step, a step of circulating and stirring a plating solution while erecting a plating cup and efficiently dissolving/discharging a precipitate. This step is performed for each wafer to be treated.

13 Claims, 40 Drawing Sheets

Fig. 24 Completion of filling with plating solution & circulation of plating solution (cleaning)

Counterclockwise stirring (cleaning)

Clockwise stirring (cleaning)

Circulation of plating solution (completion of cleaning)

Fig. 29
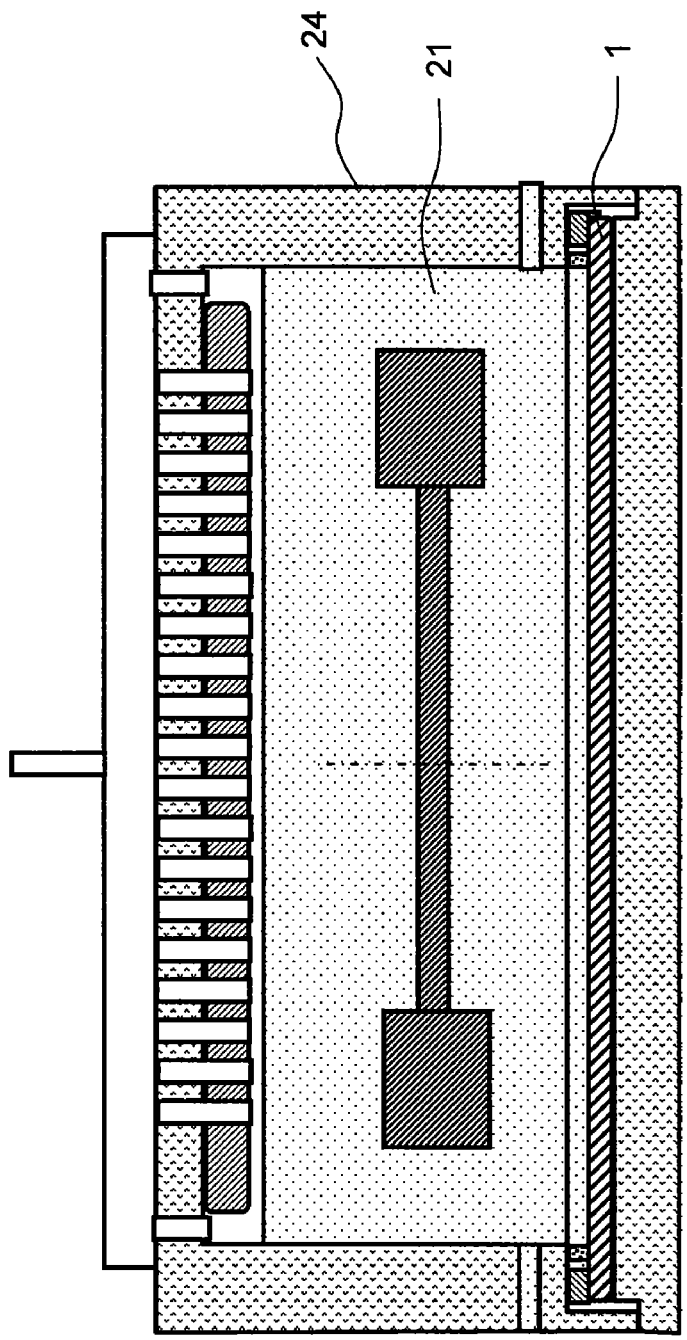
Inversion of cup
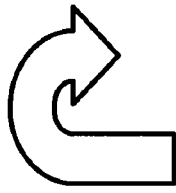

Complete filling with plating solution

Counterclockwise stirring

Circulation of plating solution

Clockwise stirring

Circulation of plating solution

Termination of circulation of plating solution

Re-inversion of cup (completion of plating)

Discharge of plating solution

Completion of discharge of plating solution

MANUFACTURING METHOD OF SEMICONDUCTOR INTEGRATED DEVICE WITH INVERTING PLATING CUP

CLAIM OF PRIORITY

The Present application claims priority from Japanese application JP 2007-285969 filed on Nov. 2, 2007, the content of which is hereby incorporated by reference into this application.

FIELD OF THE INVENTION

The present invention relates to a bump formation technology in manufacturing methods of a semiconductor integrated circuit device (or a semiconductor device). In particular, the invention pertains to a technology effective when applied to a gold bump formation technology.

BACKGROUND OF THE INVENTION

Japanese Unexamined Patent Publication No. Hei 8(1996)-311699 (Patent Document 1) discloses a technology of stirring a plating solution present in the vicinity of a wafer with a view to minimizing unevenness of a plating thickness during electroplating of the wafer.

Japanese Unexamined Patent Publication No. 2006-22379 (Patent Document 2) discloses, in gold electroplating for the formation of a bump electrode of a wafer or the like, an electroplating technology using an anode electrode obtained by platinizing a titanium base material and then coating the resulting base material with iridium oxide in order to improve the evenness of a plating thickness and eliminate maintenance of a plating apparatus.

Japanese Unexamined Patent Publication No. 2004-197228 (Patent Document 3) discloses, in copper electroplating for damascene interconnection, a technology of plating at a low electric current first and then plating at a high electric current in order to form a buried copper interconnect having no voids.

[Patent Document 1]
Japanese Unexamined Patent Publication No. Hei 8(1996)-311699
[Patent Document 2]
Japanese Unexamined Patent Publication No. 2006-22379
[Patent Document 3]
Japanese Unexamined Patent Publication No. 2004-197228

SUMMARY OF THE INVENTION

The manufacture of semiconductor products such as LCD drivers includes a bump/plating step for the formation of a gold bump electrode having a size of from about 15 to 20 μm. This bump electrode is required to have highly uniform thickness for ensuring mounting. As a result of comparison and investigation of various types of plating apparatuses, the present inventors have found that a method of setting a wafer to be treated on the apparatus, inverting a plating cup, and carrying out plating with the device surface of the wafer up is advantageous from the viewpoint of reduction in air bubbles and uniform plating.

The present inventors have however elucidated that in this bump/plating step performed by electroplating with a certain plating solution, projections appear intermittently on a bump electrode during mass production. The projections on the bump electrode become a significant barrier to mounting work. The investigation has revealed its cause as follows.

Described specifically, when a plating solution becomes dry in a plating tank during an interval of plating between lots or wafers, a precipitate attaches to the inside of the plating tank. When a subsequent plating operation is started before the precipitate does not dissolve sufficiently in the plating solution, the precipitate attaches to the wafer and becomes a nucleus of abnormally growing projection. It has been found that only extension of an ordinary stirring time performed prior to plating is almost useless for dissolving the precipitate.

An object of the invention is to provide a highly-reliable manufacturing method of a semiconductor integrated circuit device.

The above-described and other objects and novel features of the present invention will be apparent from the description herein and attached drawings.

The outline of the typical inventions disclosed herein will next be described briefly.

In the invention, abnormal growth of projections on a gold bump electrode is prevented by carrying out for each wafer to be treated, prior to a gold bump/plating step, a step of circulating and stirring a plating solution while erecting a plating cup and efficiently dissolving/discharging a precipitate.

Advantages available from the typical inventions disclosed herein will next be described briefly.

Abnormal growth of projections on a gold bump electrode is prevented by carrying out for each wafer to be treated, prior to a gold bump/plating step, a step of circulating and stirring a plating solution while erecting a plating cup and efficiently dissolving/discharging a precipitate in the plating solution.

BRIEF DESCRIPTION OF THE DRAWINGS

FIG. 29 is a cross-sectional view of the plating cup at the time of inversion of the plating cup for plating (including prior stirring) in the gold bump plating process in the manufacturing method of a semiconductor integrated circuit device according to the one embodiment of the invention;

DETAILED DESCRIPTION OF THE PREFERRED EMBODIMENTS

Outline of Embodiment

Figure 1:
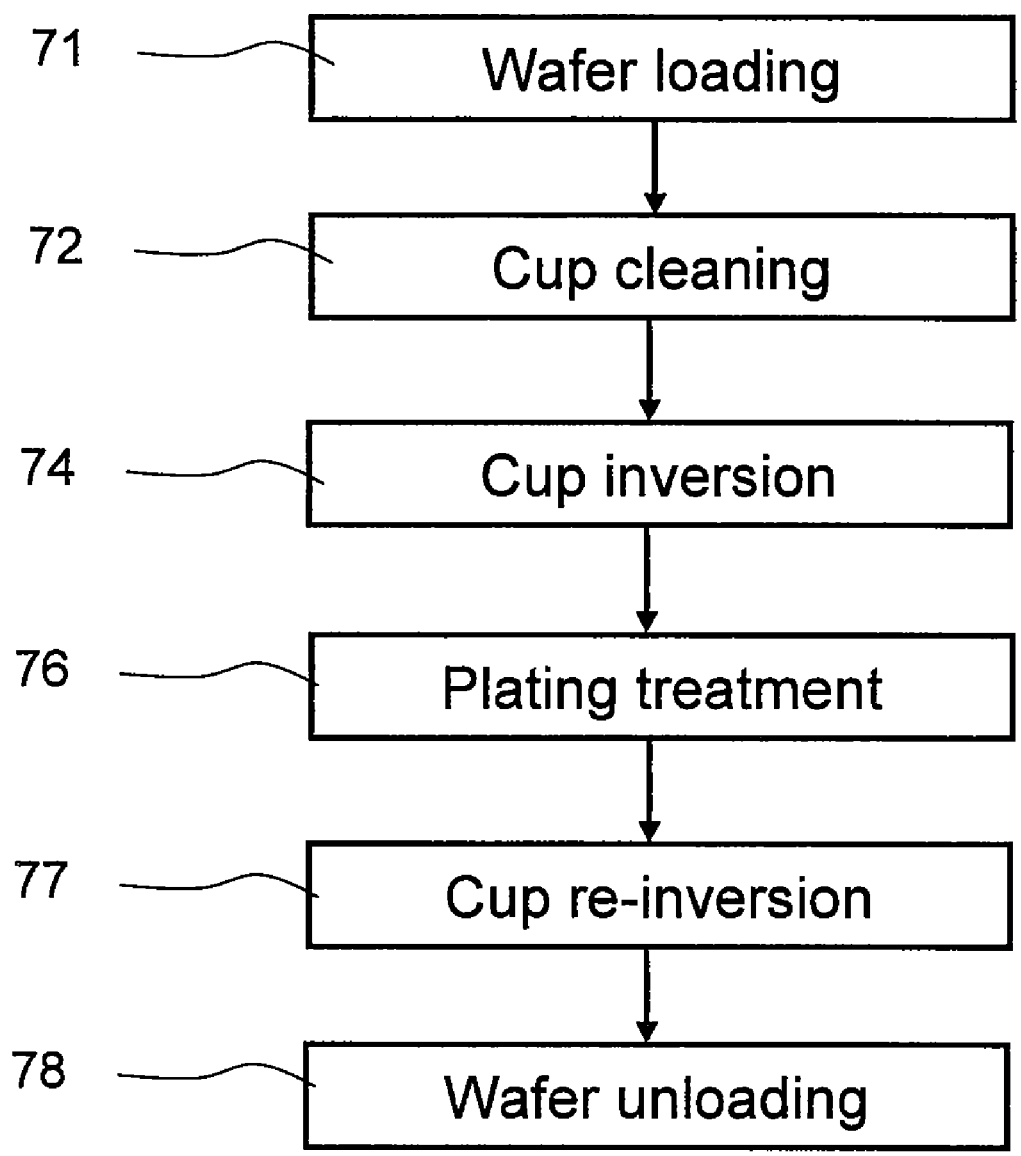
FIG. 1 is a process block flow chart illustrating a gold bump plating process flow in a manufacturing method of a semiconductor integrated circuit device according to one embodiment of the invention.

First, the outline of typical embodiments of the invention disclosed herein will be described.

1. A manufacturing method of a semiconductor integrated circuit device comprises the steps of:

(a) forming a resist film having a plurality of openings over a first main surface of a wafer;

(b) introducing the wafer having the resist film into a single-wafer plating apparatus having a plating cup;

(c) loading, in the single-wafer plating apparatus, the wafer having the resist film in the plating cup so that the first main surface lies opposite to a plating tank of the plating cup;

(d) after the step (b), introducing a plating solution into the plating tank;

(e) after the step (d), stirring the plating solution in the plating tank;

(f) after the steps (c) and (e), forming a gold bump electrode by electroplating over the opening portions over the first main surface; and (g) after the step (f), unloading the wafer from the plating cup, wherein the attitude of the plating cup differs between the step (e) and the step (f).

2. The manufacturing method of a semiconductor integrated circuit device as described above in 1, wherein the step (d) follows the step (c).

3. The manufacturing method of a semiconductor integrated circuit device as described above in 1 or 2, wherein the plating solution is a non-cyanide type.

4. The manufacturing method of a semiconductor integrated circuit device as described above in any one of 1 to 3, wherein stirring of the plating solution in the step (e) is performed while loading the wafer in the plating cup.

5. The manufacturing method of a semiconductor integrated circuit device as described above in any one of 1 to 4, wherein the steps (d) and (e) are performed with the first main surface of the wafer down.

6. The manufacturing method of a semiconductor integrated circuit device as described above in any one of 1 to 5, wherein the step (e) is performed while filling the plating solution in the plating tank to such a level as to bring the plating solution into contact with the first main surface of the wafer.

7. The manufacturing method of a semiconductor integrated circuit device as described above in any one of 1 to 6, further comprising the steps of:

(h) after the steps (c) and (e) but before the step (f), stirring the plating solution in the plating tank while keeping the attitude of the plating cup substantially the same as that in the step (f).

8. The manufacturing method of a semiconductor integrated circuit device as described above in 7, wherein after the step (h), the step (f) is performed without discharging the plating solution.

9. The manufacturing method of a semiconductor integrated circuit device as described above in any one of 1 to 8, wherein the step (f) is performed with the first main surface of the wafer up.

10. The manufacturing method of a semiconductor integrated circuit device as described above in any one of 1 to 9, wherein the step (f) is performed while filling the plating tank with the plating solution.

11. The manufacturing method of a semiconductor integrated circuit device as described above in any one of 1 to 10, wherein the electroplating in the step (f) is performed using an anode electrode having iridium oxide as a main component.

12. The manufacturing method of a semiconductor integrated circuit device as described above in any one of 1 to 11, wherein the step (f) comprises the following substeps of:

(f1) supplying a first current to the plating tank to perform electroplating; and (f2) after the substep (f1), supplying a second current greater than the first current to perform electroplating.

13. The manufacturing method of a semiconductor integrated circuit device as described above in any one of 1 to 12, wherein the resist film of the step (a) is formed by the method of application.

14. The manufacturing method of a semiconductor integrated circuit device as described above in any one of 1 to 13, wherein the steps (e) and (f) are carried out while circulating the plating solution by introducing the plating solution from a portion of the plating tank in the vicinity of the wafer and at the same time, discharging the plating solution from the bottom of the plating tank.

15. A manufacturing method of a semiconductor integrated circuit device, comprising the steps of:

(a) forming a resist film having a plurality of openings over a first main surface of a wafer;

(b) introducing the wafer having the resist film into a single-wafer plating apparatus having a plating cup;

(c) loading, in the single-wafer plating apparatus, the wafer having the resist film in the plating cup so as to place the wafer with the first main surface down and opposite to a plating tank of the plating cup;

(d) after the step (c), introducing a plating solution into the plating tank;

(e) after the step (d), stirring the plating solution in the plating tank;

(f) after the step (e), forming a gold bump electrode by electroplating in the opening portions over the first main surface in the plating tank, while inverting the plating cup;

(g) after the step (f), discharging the plating solution from the plating tank while re-inverting the plating cup to restore the original attitude; and (h) after the step (g), unloading the wafer from the plating cup.

16. The manufacturing method of a semiconductor integrated circuit device as described above in 15, wherein the plating solution is introduced from a portion of the plating cup in the vicinity of the wafer and discharged from the bottom of the plating cup.

17. The manufacturing method of a semiconductor integrated circuit device as described above in 15 or 16, wherein the steps (e) and (f) are performed while circulating the plating solution by introducing the plating solution from the portion of the plating cup in the vicinity of the wafer and at the same time, discharging the plating solution from the bottom of the plating cup.

18. The manufacturing method of a semiconductor integrated circuit device as described above in any one of 15 to 17, further comprising a step of:

(i) after the step (e) and before the step (f), stirring the plating solution in the plating tank while inverting the plating cup.

19. The manufacturing method of a semiconductor integrated circuit device as described above in any one of 15 to 18, wherein the electroplating in the step (f) is performed using an anode electrode having iridium oxide as a main component.

20. The manufacturing method of a semiconductor integrated circuit device as described above in any one of 15 to 19, wherein the step (f) comprises the following substeps of:

(f1) supplying a first current to the plating tank to perform electroplating; and (f2) after the substep (f1), supplying a second current greater than the first current to perform electroplating.

21. The manufacturing method of a semiconductor integrated circuit device as described above in any one of 15 to 20, wherein the plating solution is a non-cyanide type.

22. The manufacturing method of a semiconductor integrated circuit device as described above in any one of 15 to 21, wherein formation of the resist film in the step (a) is performed by the method of application.

23. The manufacturing method of a semiconductor integrated circuit device as described above in any one of 18 to 22, wherein after the step (i), the step (f) is performed without discharging the plating solution.

[Description Form, Basic Terms, and Usage Herein]

1. In the embodiments, a description may be made after divided in plural sections if necessary for convenience's sake. These plural sections are not independent each other, but they may each be a part of a single example or one of them may be partial details of the other or a modification example of a part or whole of the other unless otherwise specifically indicated. In principle, description is not repeated with regards to similar portions. In the embodiments, when a reference is made to constituent elements, they are not essential unless otherwise specifically indicated, limited to the number theoretically, or principally apparent from the context that it is not.

2. In the embodiments, when "X made of A" or the like is used with regard to the material, composition or the like of X, a component other than A is not excluded from main constituting elements of A unless otherwise specifically indicated or principally apparent from the context it is not. For example, with regard to a component, the above-described sentence means "X containing A as a main component". For example, the term "gold bump electrode" means not only a pure gold bump electrode but also a bump electrode made of a gold alloy having gold as a main component. Similarly, it is needless to say that the term "silicon member" means not only a member made of pure silicon but also a member containing a SiGe alloy or another multielement alloy having silicon as a main component and an additive. Similarly, it is needless to say that the term "silicon oxide film" means not only relatively pure undoped silicon dioxide but also FSG (fluorosilicate glass), TEOS-based silicon oxide, SiOC (silicon oxycarbide), or carbon-doped silicon oxide, or a thermal oxidation film such as OSG (organosilicate glass), PSG (phosphorus silicate glass), or BPSG (borophosphosilicate glass), a CVD oxide film, a film obtained by method of application such as SOG (spin on glass) or nano-clustering silica (NSC), or a silica Low-k insulating film (porous insulating film) obtained by introducing pores into a member similar thereto, or a composite film of the above-described film as a major constituent component with another silicon insulating film.

The term "silicon nitride film" embraces not only a film having a stoichiometric composition but also a film containing, in addition, a certain amount of an additional component such as hydrogen or oxygen.

3. Similarly, preferred examples of the shape, position, attribute or the like are shown, but it is needless to say that the shape, position, attribute, or the like is not limited strictly to the preferred one unless otherwise specifically indicated or principally apparent from the context that it is not.

4. In the embodiments, when a reference is made to a specific number or amount, the number or amount can be greater than or less than the specific number or amount unless otherwise specifically indicated, limited to the specific number or amount theoretically, or apparent from the context that it is not.

5. The term "wafer" means a single crystal silicon wafer over which a semiconductor integrated circuit device (semiconductor device or an electronic device) is to be formed, but it is needless to say that it embraces an epitaxial wafer, a composite wafer of an insulating substrate with a semiconductor layer, and the like.

6. The term "inside" of a wafer treatment apparatus means inside of a wafer carrier vessel such as wafer cassette when it is placed on a wafer port or a wafer carrier vessel such as foup when it is linked to the wafer port. When the wafer carrier vessel moves outside of the wafer port or the link of it is released, on the other hand, the term "inside" of the wafer carrier vessel means outside of the wafer treatment apparatus.

7. The term "discharge" of a plating solution or a chemical solution (plating solution or the like) from a plating tank means a complete or partial (mainly, great) reduction of the level of the plating solution or the like unless otherwise apparent from the context (in the case where a reference is made to circulation or the like). Such a definition is made because it is necessary to distinguish it from circulation (successive discharge and introduction) of a plating solution or the like in a plating tank during plating. "Discharge" is usually replaced by gas purging in order to keep the pressure in the plating tank constant. The term "introduction" means a complete or partial increase in the level of the plating solution or the like unless otherwise principally apparent from the context that it is not. More specifically, "discharge" and "introduction" are often controlled by adjusting an introduction amount and a discharge amount (including adjusting either one to zero) in a circulation state. It is to be noted that the "chemical solution" means not only an aqueous solution but it may be pure water itself.

8. With regard to an introduction port or a discharge port of the plating tank in a plating cup, the term "lower portion of the plating tank" means a bottom surface opposite to the wafer loaded in the plating cup or a side surface in the vicinity of the bottom surface. Similarly, the term "upper portion of the plating tank" means an upper surface (surface opposite to the bottom surface) in the vicinity of the wafer loaded in the plating cup or a side surface in the vicinity thereof. Since the cup is inverted, the definitions of "upper" and "lower" are made with the erecting cup as a standard only in this case, irrespective of the presence or absence of inversion.

9. When the term "similar composition" is used for the plating solution or the like, it is needless to say that the term embraces the case, as a case where a plating solution or the like is shared in various steps within a circulation system, where the same material is shared in the various steps.

10. The term "single wafer" plating apparatus means an apparatus for treating one wafer at a time by a single cup irrespective of the number of plating cups of the plating apparatus.

Details of Embodiments

Embodiments of the invention will next be described in detail. Note that in all the drawings, like symbols or reference numerals refer to identical or similar elements and any duplicative explanation will be eliminated in principle.

1. Description of the Outline of a Gold Bump Plating Process and a Device to be Plated Thereby in the Manufacturing Method of a Semiconductor Integrated Circuit Device According to this Embodiment (Mainly from FIG. 1 to FIG. 4)

Figure 2:
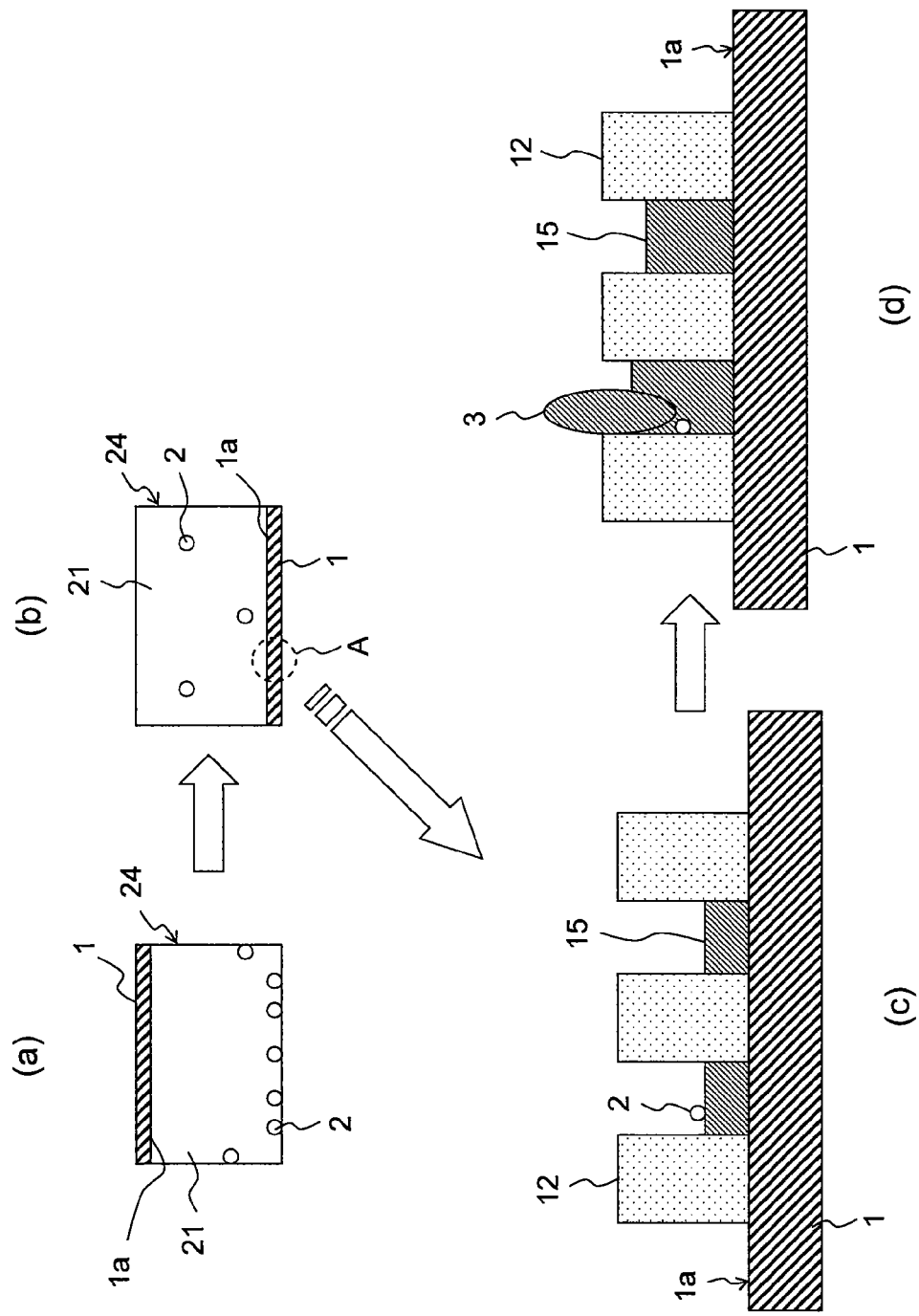
FIGS. 2(a) to 2(d) are schematic cross-sectional views of a plating apparatus and a semiconductor integrated circuit device which are illustrated for describing the problem of the plating apparatus to be used for the gold bump plating process in the manufacturing method of a semiconductor integrated circuit device according to the one embodiment of the invention.

FIG. 1 is a process block flow chart illustrating the outline of a gold bump plating process flow in the manufacturing method of a semiconductor integrated circuit device according to the one embodiment of the invention. FIGS. 2(a) to 2(d) are schematic cross-sectional views of a plating apparatus and a semiconductor integrated circuit device which are illustrated for describing the problem of the plating apparatus to be used for the gold bump plating process in the manufacturing method of a semiconductor integrated circuit device according to the one embodiment of the invention. FIG. 2(a) is a cross-sectional view of a plating cup 24 in an erected state, while FIG. 2(b) is a cross-sectional view of the plating cup 24 in an inverted state. FIG. 2(c) and FIG. 2(d) are enlarged schematic cross-sectional views of a portion A of FIG. 2(b) and they are cross-sectional flow views illustrating a projection occurring mechanism. Based on these drawings, the outline of the gold bump plating process in the manufacturing method of a semiconductor integrated circuit device according to this embodiment will hereinafter be described. As illustrated in FIG. 1 or FIG. 2, first, a wafer 1 to be treated is loaded in the plating cup 24 (wafer loading step 71). The wafer 1 is loaded with a device surface 1a down (in the direction of gravity). Such positioning is employed because a precipitate 2 which is relatively heavy does not attach to the device surface 1a and is discharged swiftly from the lower portion along a liquid stream (circulation stream) from the vicinity of the upper portion to the lower portion.

In the next place, a plating solution 21 is filled so that the upper surface of the plating solution comes in contact with the device surface 1a of the wafer 1 and it is stirred while circulating it to dissolve therein the precipitate 2 (cup cleaning step 72). The reason why the plating solution 21 is not filled in the cup completely, in other words, 100% of the cup is not filled (introduced) with the plating solution 21 is because a gas layer remains over the plating solution 21 owing to the structure of the apparatus. If the gas layer does not remain, 100% of the cup may be filled. When plating of a gold bump electrode 15 is performed without removing the precipitate 2 from the device surface 1a of the wafer 1, especially, from the opening portion of a photoresist film 12, abnormal growth of plating occurs, which leads to appearance of a projection 3. The cleaning step 72 is therefore necessary. After completion of the cleaning step 72, circulation of the plating solution stops and during this temporary down period, the plating cup 24 is inverted (cup inversion step 74). The inversion of the plating cup 24 is not always necessary, but plating while inverting the cup can reduce attachment of air bubbles onto the wafer 1 because of gravity. When the circulation of the plating solution is started again while inverting the plating cup 24, almost 100% of the cup is filled (completely filled) swiftly with the plating solution 21. Complete filling with the plating solution 21 is not always necessary, but complete filling is effective for reducing air bubbles. Then, plating treatment is performed while circulating the plating solution 21 with the plating cup 24 being inverted (plating treatment step 76). After completion of the plating treatment, the plating cup 24 is re-inverted (plating cup re-inversion step 77). The plating solution 21 is discharged with the plating cup 24 being inverted. Then, the wafer 1 is unloaded from the plating cup 24 (wafer unloading step 78).

Figure 3:
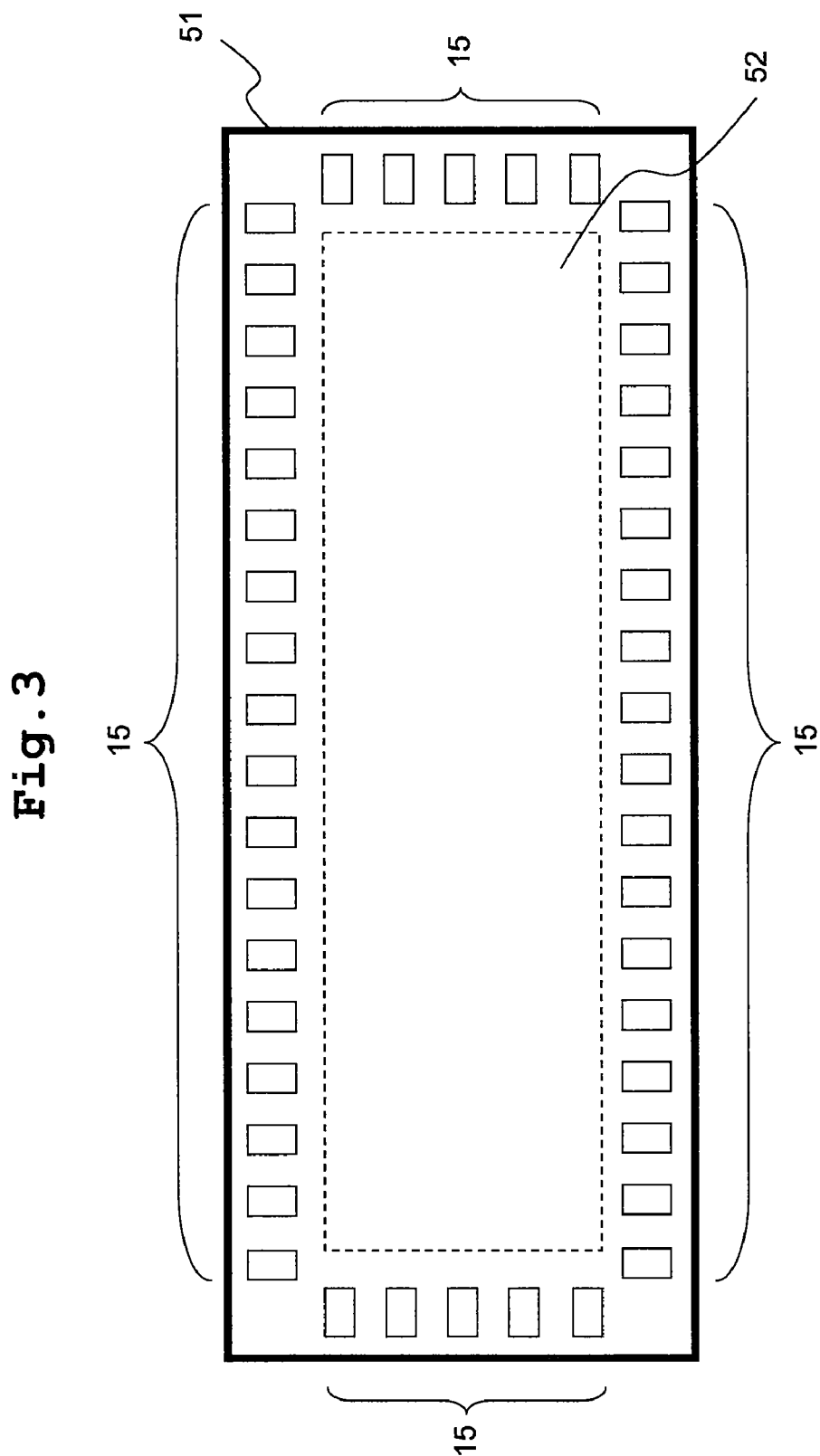
FIG. 3 is a top view of a chip illustrating one example of a semiconductor integrated circuit device (semiconductor device) obtained by the manufacturing method of a semiconductor integrated circuit device according to the one embodiment of the invention.

FIG. 3 is a top view of a chip illustrating one example of a semiconductor integrated circuit device (semiconductor device) obtained by the manufacturing method of a semiconductor integrated circuit device according to the one embodiment of the invention. This is an example of a chip for a liquid crystal display device, that is, LCD driver. The chip 51 has thereon a circuit region 52 and a number of bump electrodes 15 are arranged at the periphery thereof.

Figure 4:
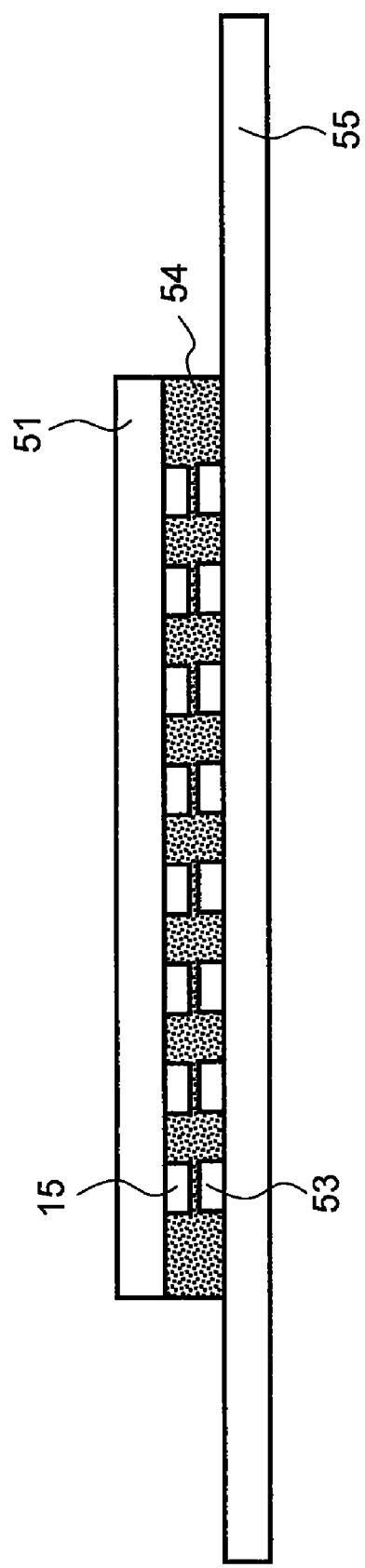
FIG. 4 is a cross-sectional view illustrating the structure in which a semiconductor integrated circuit device (semiconductor device) obtained by the manufacturing method of a semiconductor integrated circuit device according to the one embodiment of the invention has been loaded to a liquid-crystal display device.

FIG. 4 is a cross-sectional view illustrating a structure of a liquid-crystal display device in which a semiconductor integrated circuit device (semiconductor device) obtained by the manufacturing method of a semiconductor integrated circuit device according to the one embodiment of the invention has been loaded. As illustrated in FIG. 4, a plurality of conductor external electrodes such as ITO (indium tin oxide) electrodes 53 are placed on a liquid-crystal substrate 55 of the liquid crystal display device and are electrically coupled to a plurality of gold bump electrodes 15 over the chip 51 for LCD driver via an anisotropic conductive film (ACF) 54. Unevenness in the thickness of the gold bump electrodes 15 at this stage is highly likely to cause inconveniences such as increased coupling resistance between some electrodes.

2. Description of the Entire Process of the Manufacturing Method of a Semiconductor Integrated Circuit Device According to this Embodiment, and a Device to be Treated (Mainly, from FIG. 5 to FIG. 12)

Figure 5:
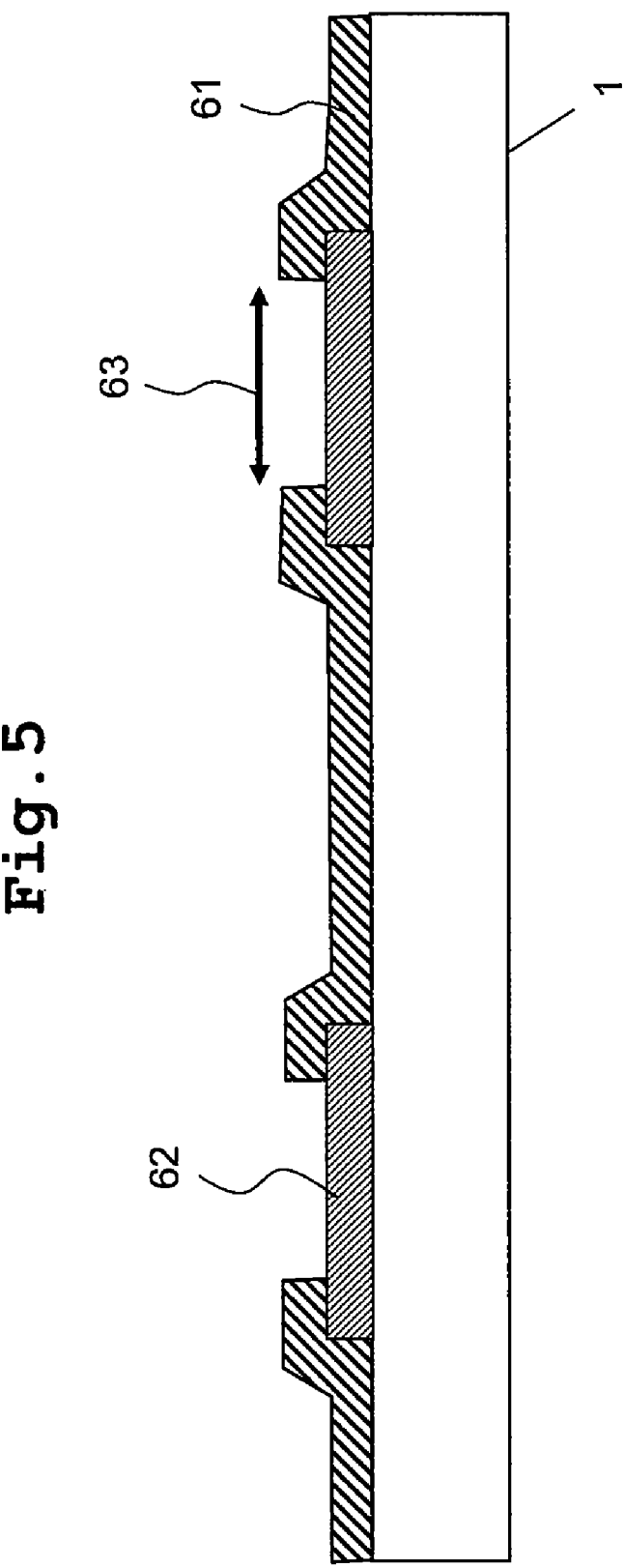
FIG. 5 is a schematic cross-sectional view illustrating a device structure prior to bump formation treatment in the manufacturing method of a semiconductor integrated circuit device according to the one embodiment of the invention.
Figure 6:
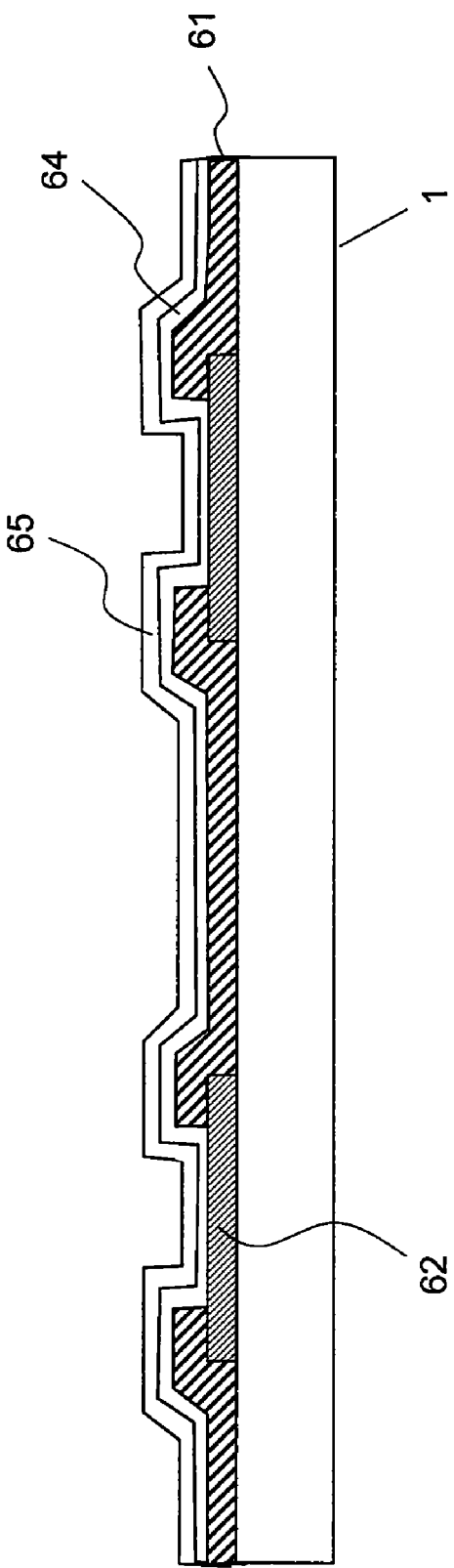
FIG. 6 is a schematic cross-sectional view illustrating a device structure during a UBM (Under Bump Metal) formation step in the manufacturing method of a semiconductor integrated circuit device according to the one embodiment of the invention.
Figure 7:
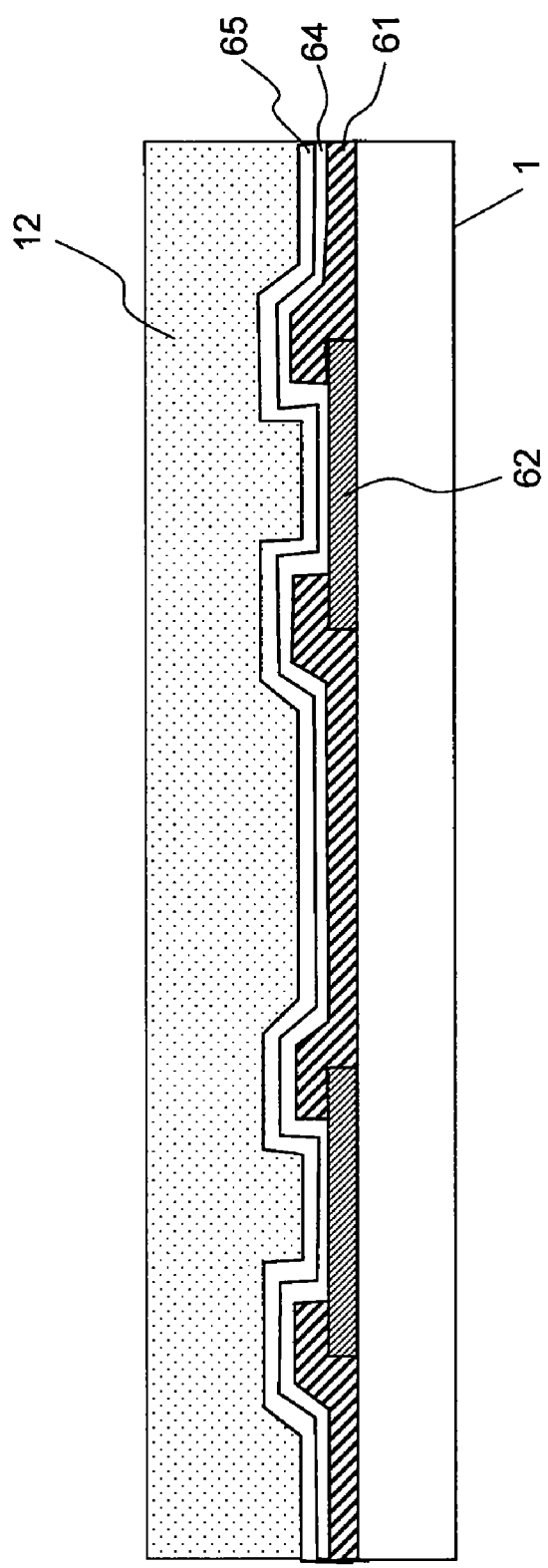
FIG. 7 is a schematic cross-sectional view illustrating a device structure which has completed a photoresist application step in the manufacturing method of a semiconductor integrated circuit device according to the one embodiment of the invention.
Figure 8:
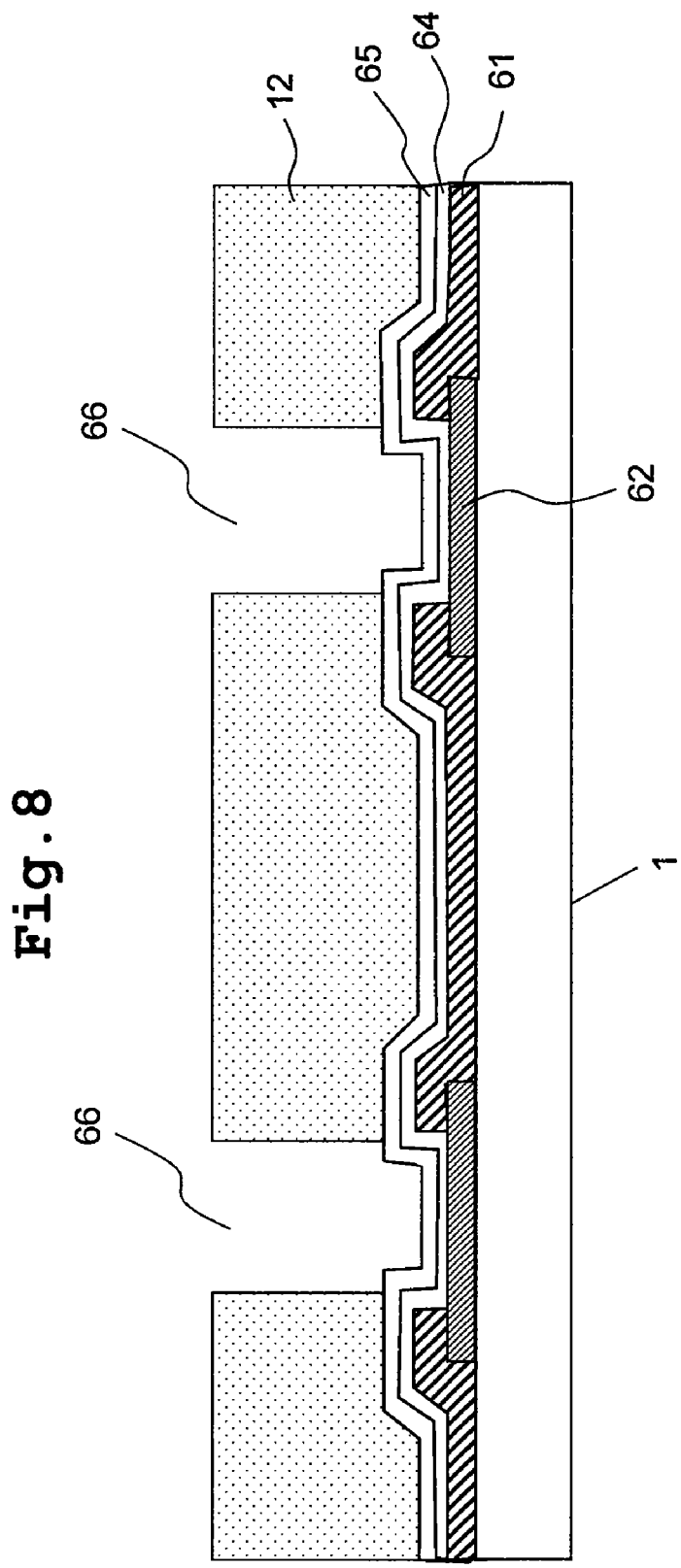
FIG. 8 is a schematic cross-sectional view illustrating a device structure which has completed a photoresist development step in the manufacturing method of a semiconductor integrated circuit device according to the one embodiment of the invention.
Figure 9:
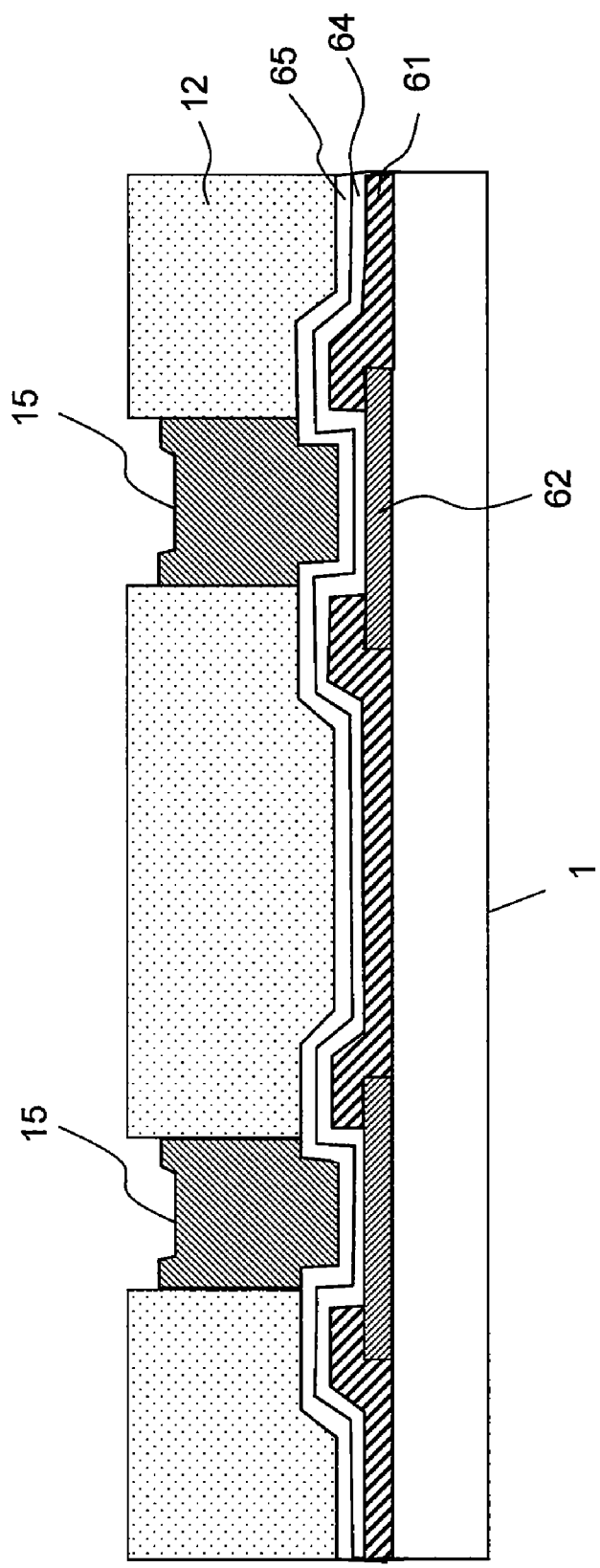
FIG. 9 is a schematic cross-sectional view illustrating a device structure which has completed a plating step in the manufacturing method of a semiconductor integrated circuit device according to the one embodiment of the invention.
Figure 10:
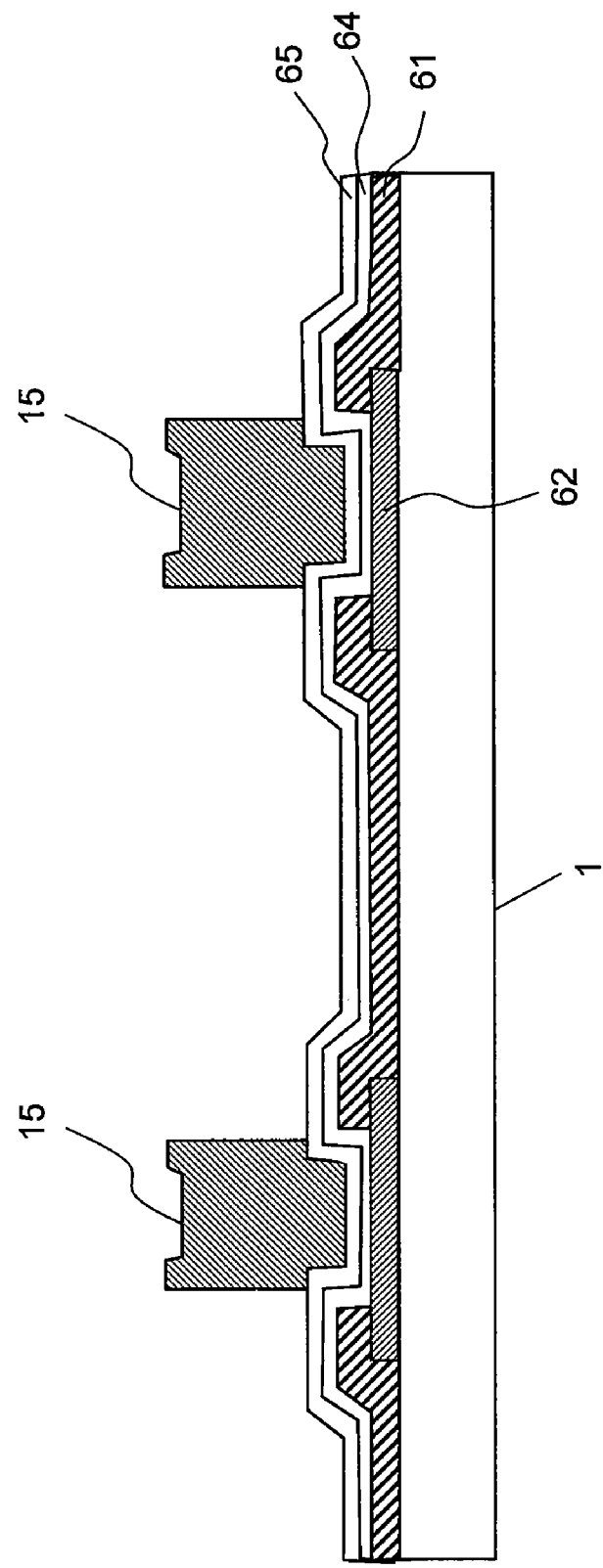
FIG. 10 is a schematic cross-sectional view illustrating a device structure which has completed a resist removal step in the manufacturing method of a semiconductor integrated circuit device according to the one embodiment of the invention.
Figure 11:
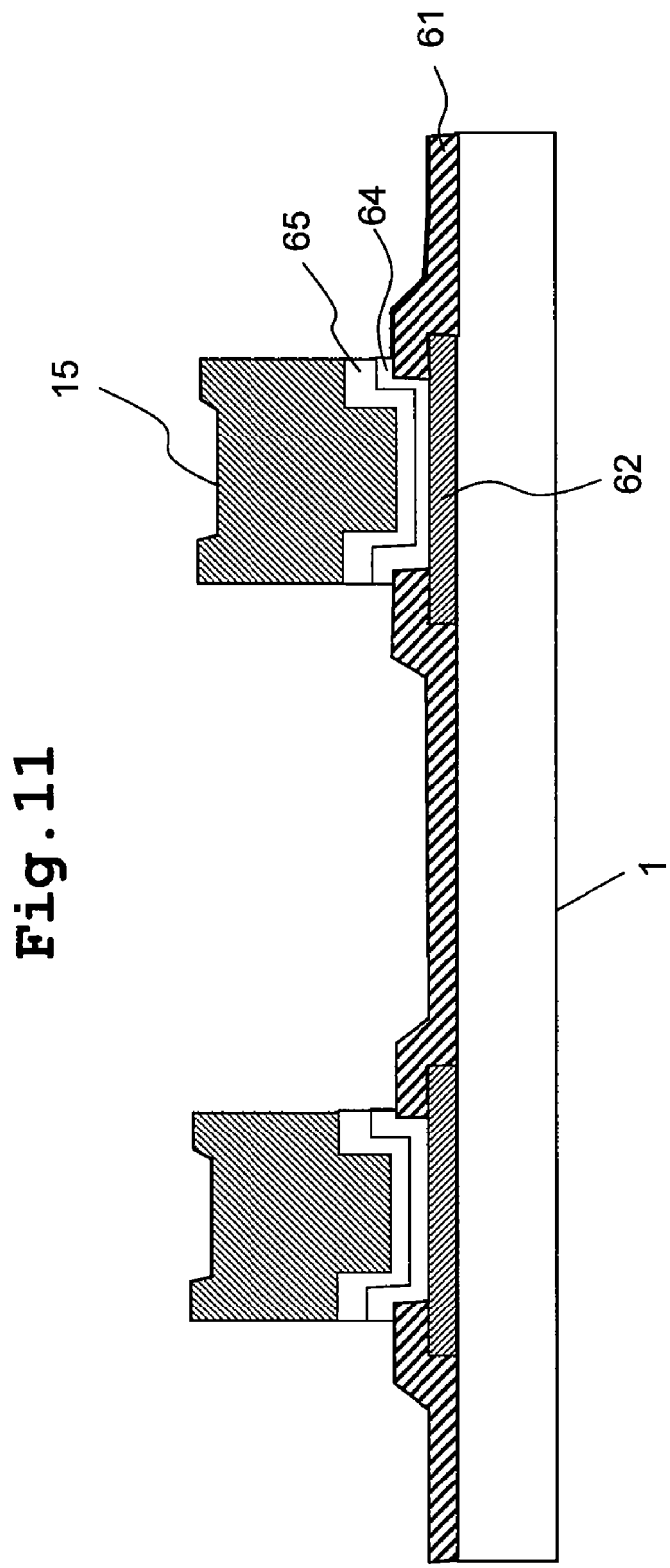
FIG. 11 is a schematic cross-sectional view illustrating a device structure which has completed a UBM etching step in the manufacturing method of a semiconductor integrated circuit device according to the one embodiment of the invention.

In the next place, a bump formation process in the manufacturing method of a semiconductor integrated circuit device according to the one embodiment of the invention will be described based on FIGS. 5 to 12. As illustrated in FIG. 5, over the main surface of the wafer 1 over which many devices and interconnects (made of a silicon oxide film or various metal layers) have been formed, a final passivation film 61 made of, for example, silicon nitride (it may be not only an inorganic film but also an organic film) is formed and a pad opening 63 is formed in a portion of the passivation film corresponding to an aluminum pad 62. As illustrated in FIG. 6, UBM (under bump metal) films, for example, a titanium film 64 (lower layer) having a thickness of about 175 μm and, for example, a palladium film 65 (upper layer) having a thickness of about 175 μm are formed successively as illustrated in FIG. 6 (these UBM materials are only exemplary and use of another material is not excluded. The palladium film may be replaced by a gold film, but use of the palladium film improves reliability. In addition, palladium is advantageous because of a lower material cost than gold). As illustrated in FIG. 7, a positive resist film 12 having a thickness of, for example, about 19 to 25 μm (for example, 20 μm) is formed over the palladium film by the above-described application system and method. A resist solution usable here is, for example, a diazo/naphthoquinone/novolac thin-film positive resist "PMER P-LA900PM", trade name; product of Tokyo Ohka Kogyo Co., Ltd. The application type resist may be replaced by a film resist. As illustrated in FIG. 8, the resist film is exposed and developed to form an opening 66. As illustrated in FIG. 9, the opening 66 is then filled with a gold layer to be a bump electrode 15 having a thickness of, for example, about 15 μm by electroplating. As illustrated in FIG. 10, the resist film 12 is then removed. Finally, as illustrated in FIG. 11, an unnecessary portion of the UBM films is removed selectively by wet etching with the gold bump 15 as a mask. As a result, a bump electrode is almost completed.

Figure 12:
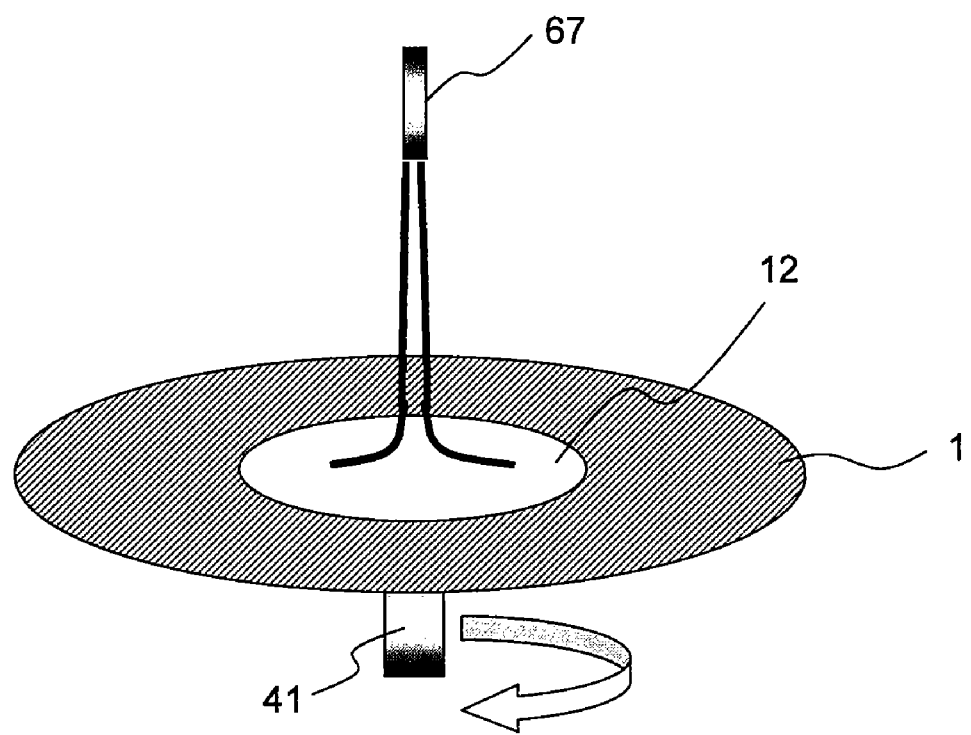
FIG. 12 is a perspective view illustrating an application portion of a resist application apparatus to be used in the manufacturing method of a semiconductor integrated circuit device according to the one embodiment of the invention.

FIG. 12 is a perspective view illustrating an application portion of a resist application apparatus to be used in the manufacturing method of a semiconductor integrated circuit device according to the one embodiment of the invention. A resist solution dropped from a nozzle 67 is spread into the resist film 12 of a predetermined thickness on the wafer 1 by high-speed rotation of a spin chuck 41.

3. Description of a Plating Apparatus to be Used for the Gold Plating Process in the Manufacturing Method of a Semiconductor Integrated Circuit Device According to this Embodiment (Mainly from FIG. 13 to FIG. 16)

Figure 13:
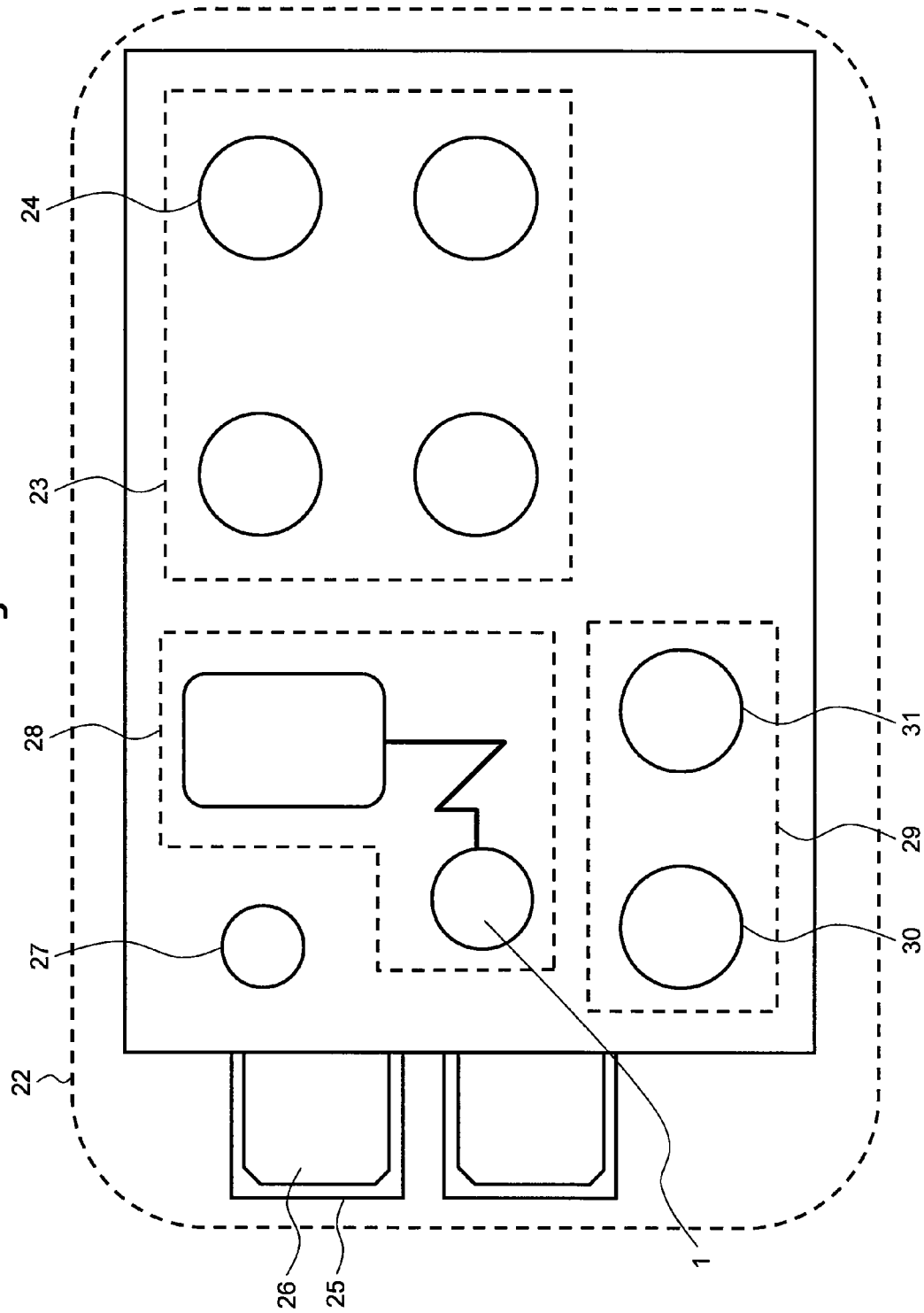
FIG. 13 is a top view of a single-wafer plating apparatus to be used for the gold bump plating process in the manufacturing method of a semiconductor integrated circuit device according to the one embodiment of the invention.

FIG. 13 is a top view of a single-wafer plating apparatus to be used for the gold bump plating process in the manufacturing method of a semiconductor integrated circuit device according to the one embodiment of the invention. Based on FIG. 13, the movement of the wafer 1 in the apparatus will next be described. Examples of the apparatus to be usable here include a full automatic plating apparatus for 300Ø wafer ("ALETA 300", trade name; product of Electroplating Engineers of Japan Ltd.). As illustrated in FIG. 13, the plating apparatus 22 is for a 300Ø wafer and is equipped with a load port 25 for setting therein a wafer housing container 26, that is, foup. The wafer 1 to be treated is taken out from the wafer housing container 26 set in the load port 25 by means of a transfer robot 28. The wafer 1 is first aligned at a wafer alignment portion 27. It is then transferred to a cleaning portion 29 by the transfer robot 28 and the device surface 1a of the wafer 1 is subjected to wet cleaning treatment with a chemical solution or pure water in a pre-treatment portion 31. Then, it is transferred to one of a plurality of plating cups 24 in a plating treatment portion 23 by the transfer robot 28 and loaded on the cup. After completion of the plating treatment, the wafer 1 is transferred to a rinsing & drying portion 30 (wet cleaning/drying portion) by the transfer robot 28 and is subjected to wet cleaning treatment such as rinsing with a chemical solution or pure water and spin drying treatment. After the drying treatment, the wafer 1 is transferred to the wafer housing container 26 or another wafer housing container as needed by the transfer robot 28.

Figure 14:
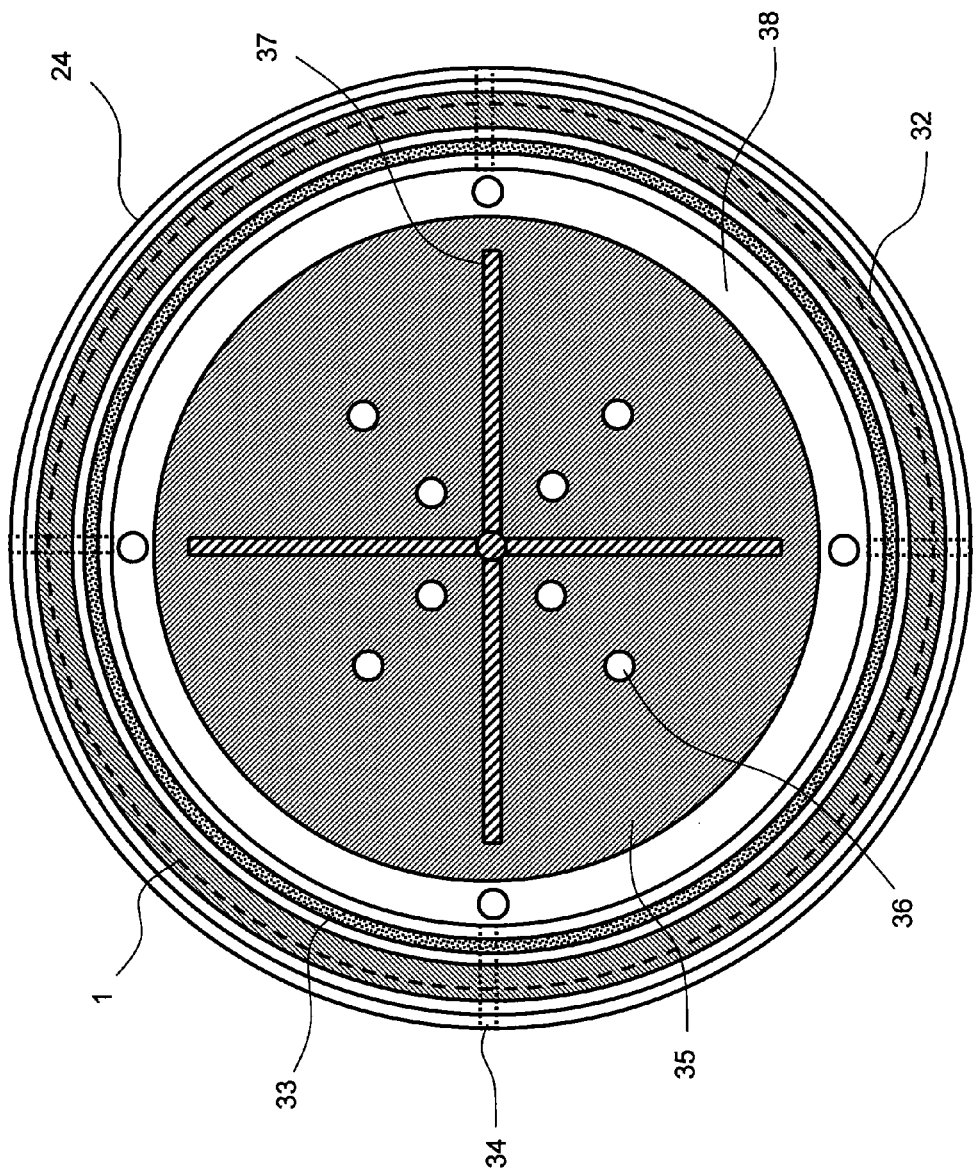
FIG. 14 is a top view of a plating tank (from which a lid is omitted to provide a good view of the inside) of the single-wafer plating apparatus to be used for the gold bump plating process in the manufacturing method of a semiconductor integrated circuit device according to the one embodiment of the invention.

FIG. 14 is a top view of a plating tank (from which a lid is omitted to provide a good view of the inside) of the single-wafer plating apparatus to be used for the gold bump plating process in the manufacturing method of a semiconductor integrated circuit device according to the one embodiment of the invention. Based on FIG. 14, the internal structure of the plating cup 24 will be described. As illustrated in FIG. 14, the plating cup 24 has a plating tank 38 and the plating tank 38 has, at the bottom surface thereof, an anode electrode 35. This anode electrode 35 is an indium oxide electrode obtained by applying indium oxide to a titanium disk which is a base material. Different from a platinum electrode or the like, this electrode does not permit attachment of gold thereto, making it possible to omit periodical maintenance which was conventionally required. Instead of the advantage that gold does not attach to the electrode, it has however the disadvantage that a precipitate containing gold is apt to appear. Accordingly, it is possible to use, without using an indium oxide electrode, another anode electrode such as platinum electrode. The plating tank 38 is equipped, at the center portion thereof, with a stirrer 37 (stirring bar) for stirring the plating solution 21. The stirrer 37 is controlled to rotate horizontally in the plating tank 38. The plating tank 38 is equipped with, at the bottom surface and anode electrode thereof, many gas/liquid discharge ports 36 for discharging a purge gas or plating solution therefrom (not all the ports are illustrated because of the convenience of illustration). The plating tank 38 has, on the upper portion of the side wall thereof, many gas/liquid introduction ports 34 for introducing a purge gas or plating solution (not all the ports are illustrated because of the convenience of illustration). These ports are placed uniformly around the circumference of the tank. The plating tank has, on the upper inside surface of the side wall thereof, an elastic ring for preventing liquid leakage, that is, a lip seal 33. On the other hand, the plating tank has, in the center portion of the upper surface of the side wall, a cathode ring electrode 32 for electrically coupling the tank to the wafer 1.

Figure 15:
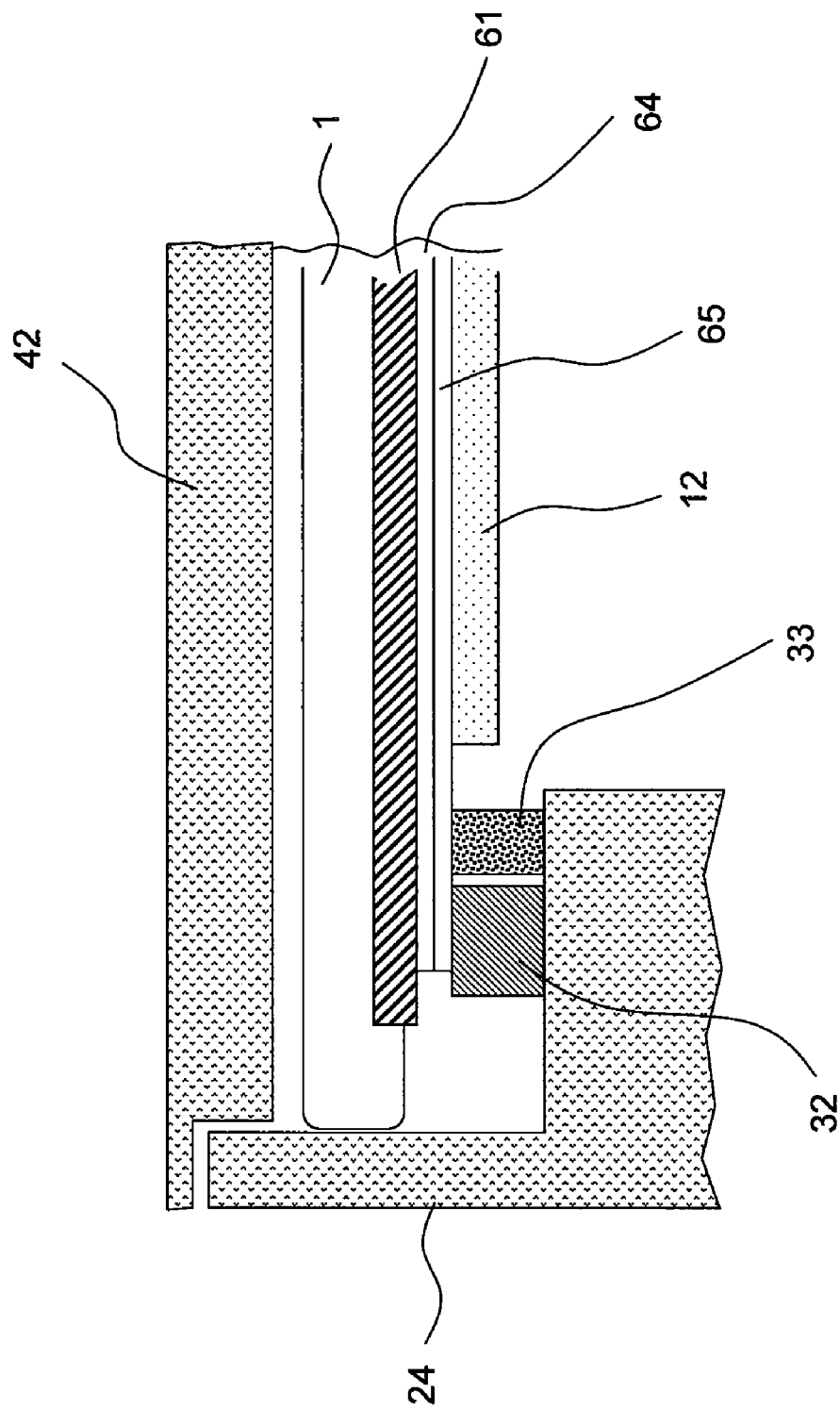
FIG. 15 is an enlarged cross-sectional view illustrating how a conductive layer on a device surface of the wafer is brought into contact with a cathode electrode of the single-wafer plating apparatus to be used for the gold bump plating process in the manufacturing method of a semiconductor integrated circuit device according to the one embodiment of the invention.

FIG. 15 is an enlarged cross-sectional view illustrating how a conductive layer on a device surface of the wafer is brought into contact with a cathode electrode of the single-wafer plating apparatus to be used for the gold bump plating process in the manufacturing method of a semiconductor integrated circuit device according to the one embodiment of the invention. Details of the loading method of the wafer 1 on the plating cup 24 will be described based on FIG. 15. As illustrated in FIG. 15, when the wafer 1 is pressed downward with a lid 42 of the plating cup 24 so as to bring the cathode ring electrode 32 into contact with the palladium layer 65 at the terminal portion of the wafer 1, the lip seal 33 is deformed to seal the plating layer 38.

Figure 16:
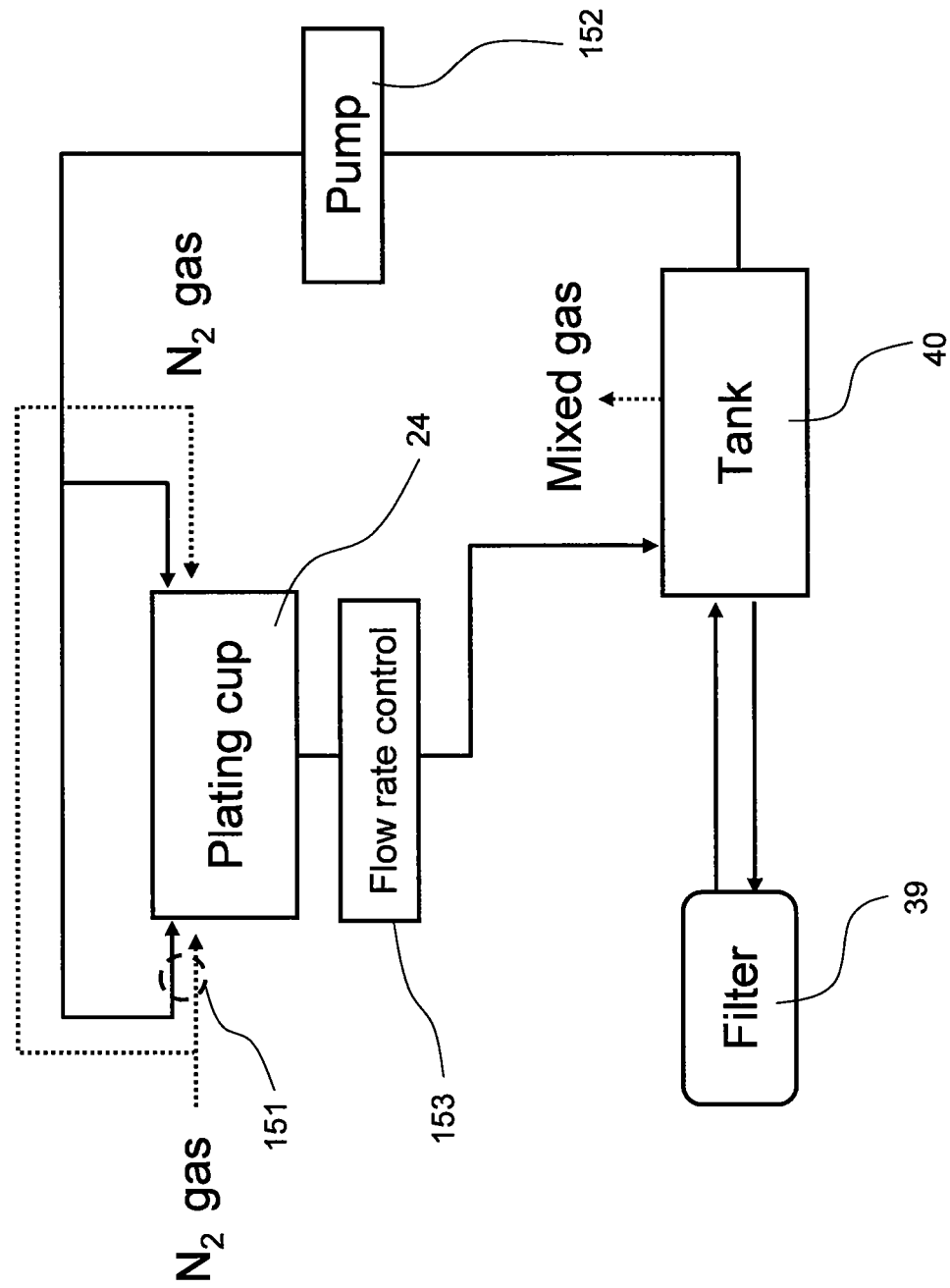
FIG. 16 is a system block chart for describing a circulation system of a plating solution or the like of the single-wafer plating apparatus to be used for the gold bump plating process in the manufacturing method of a semiconductor integrated circuit device according to the one embodiment of the invention.

FIG. 16 is a system block chart for describing a circulation system of a plating solution or the like of the single-wafer plating apparatus to be used for the gold bump plating process in the manufacturing method of a semiconductor integrated circuit device according to the one embodiment of the invention. This circulation system will next be described based on FIG. 16. As illustrated in FIG. 16, the plating solution 21 or the like (such as chemical solution, plating solution, and gas) discharged from the lower discharge port of the plating cup 24 is introduced into a tank 40 having a capacity of about 200 liter. The tank 40 and a filter 39 for removing foreign matters constitute a closed circuit system, which constantly keeps the plating solution 21 in the tank 40 clean. When it is necessary to reduce the possibility of undissolved foreign matters being discharged from one of the plating cups, being transferred to another cup, and causing a trouble, a foreign-matter removing filter or the like is inserted between each of the cups and the tank 40. In the tank 40, a mixed gas is removed and a liquid temperature is adjusted (to a temperature between from 50 to 60° C.). The plating solution 21 and the like then pass through a pump 152 and an electromagnetic switching valve 151 and are returned to the plating cup 24 via an introduction port above the plating cup 24. The flow rate of the plating solution during circulation is appropriately, for example, about 5 liter/min per cup. The introduction of a purge gas or the like is performed by switching the electromagnetic switching valve 151. The flow rate of a nitrogen gas during gas purging is appropriately, for example, about 5 liter/min per cup (under 1 atmospheric pressure). The circulation state was so far described specifically. The introduction or discharge of the plating solution is performed almost similarly by adjusting the feed amount by the pump 152 and a flow-rate control mechanism 153 on the discharge side.

4. Detailed Description of the Gold Plating Process in the Manufacturing Method of a Semiconductor Integrated Circuit Device According to this Embodiment (Mainly, from FIG. 17 to FIG. 40)

Figure 17:
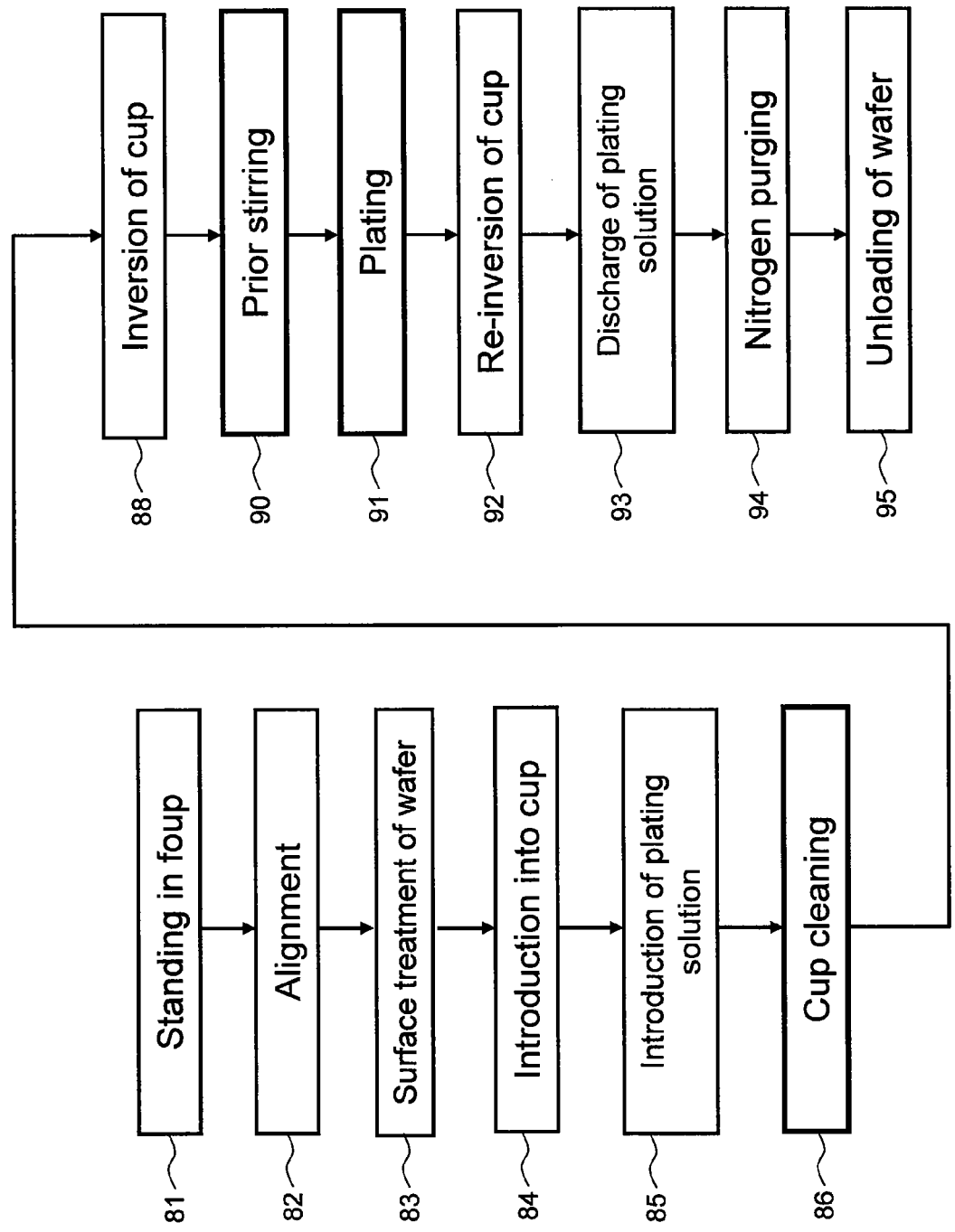
FIG. 17 is a block flow chart showing the entire flow of the gold bump plating process in the manufacturing method of a semiconductor integrated circuit device according to the one embodiment of the invention.
Figure 18:
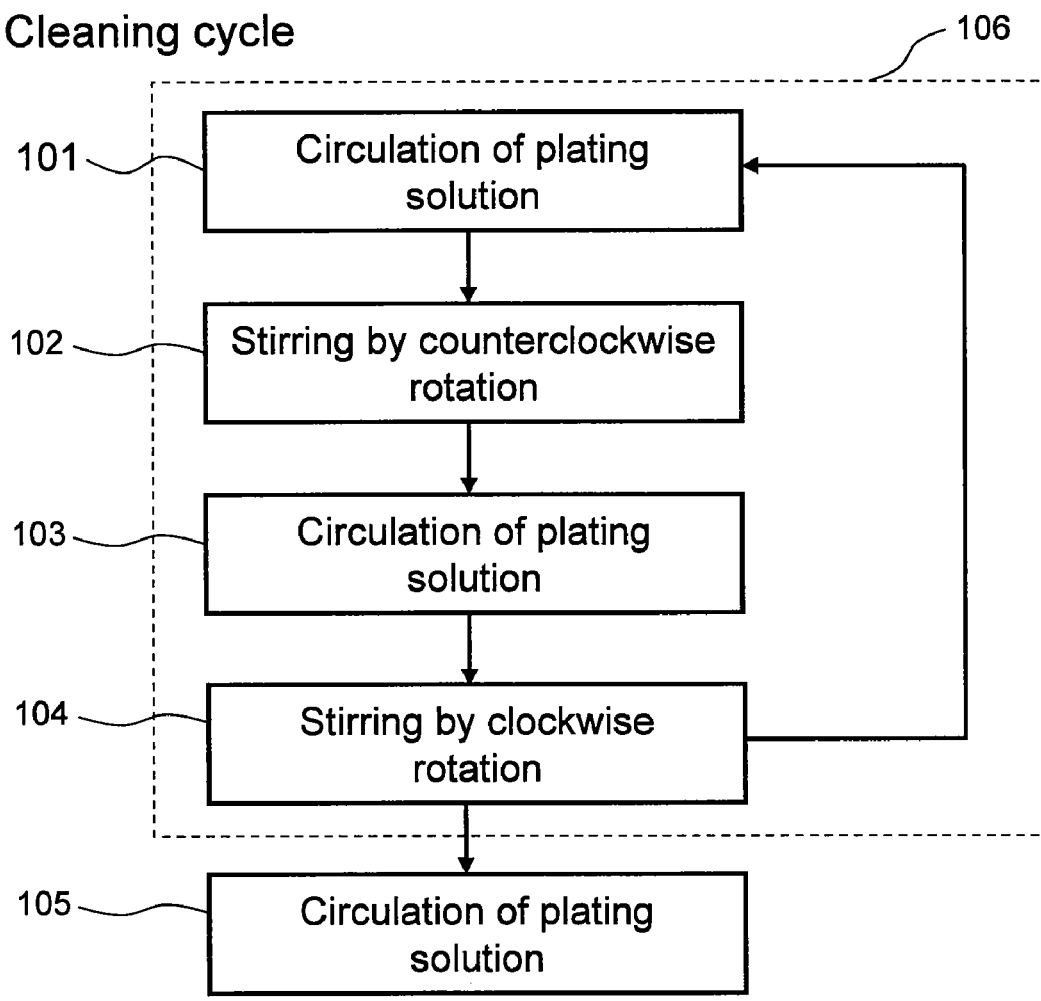
FIG. 18 is a block flow chart specifically showing the flow of a cup cleaning step in the entire flow of the gold bump plating process in the manufacturing method of a semiconductor integrated circuit device according to the one embodiment of the invention.
Figure 19:
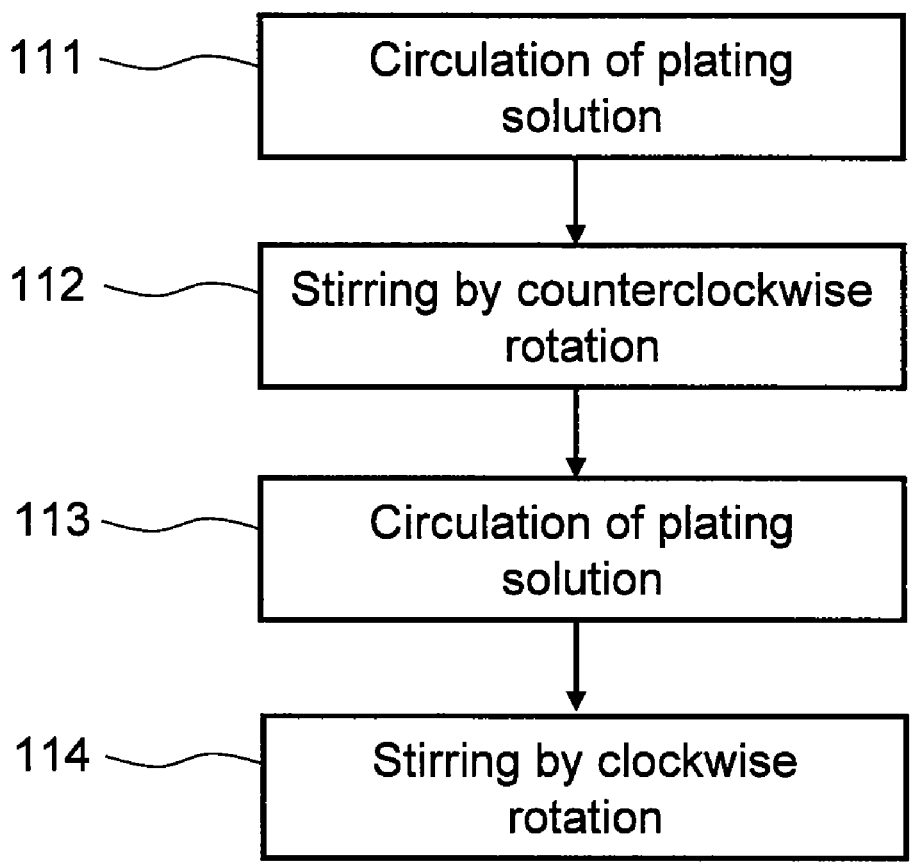
FIG. 19 is a block flow chart specifically showing the flow of a prior stirring step in the entire flow of the gold bump plating process in the manufacturing method of a semiconductor integrated circuit device according to the one embodiment of the invention.
Figure 20:
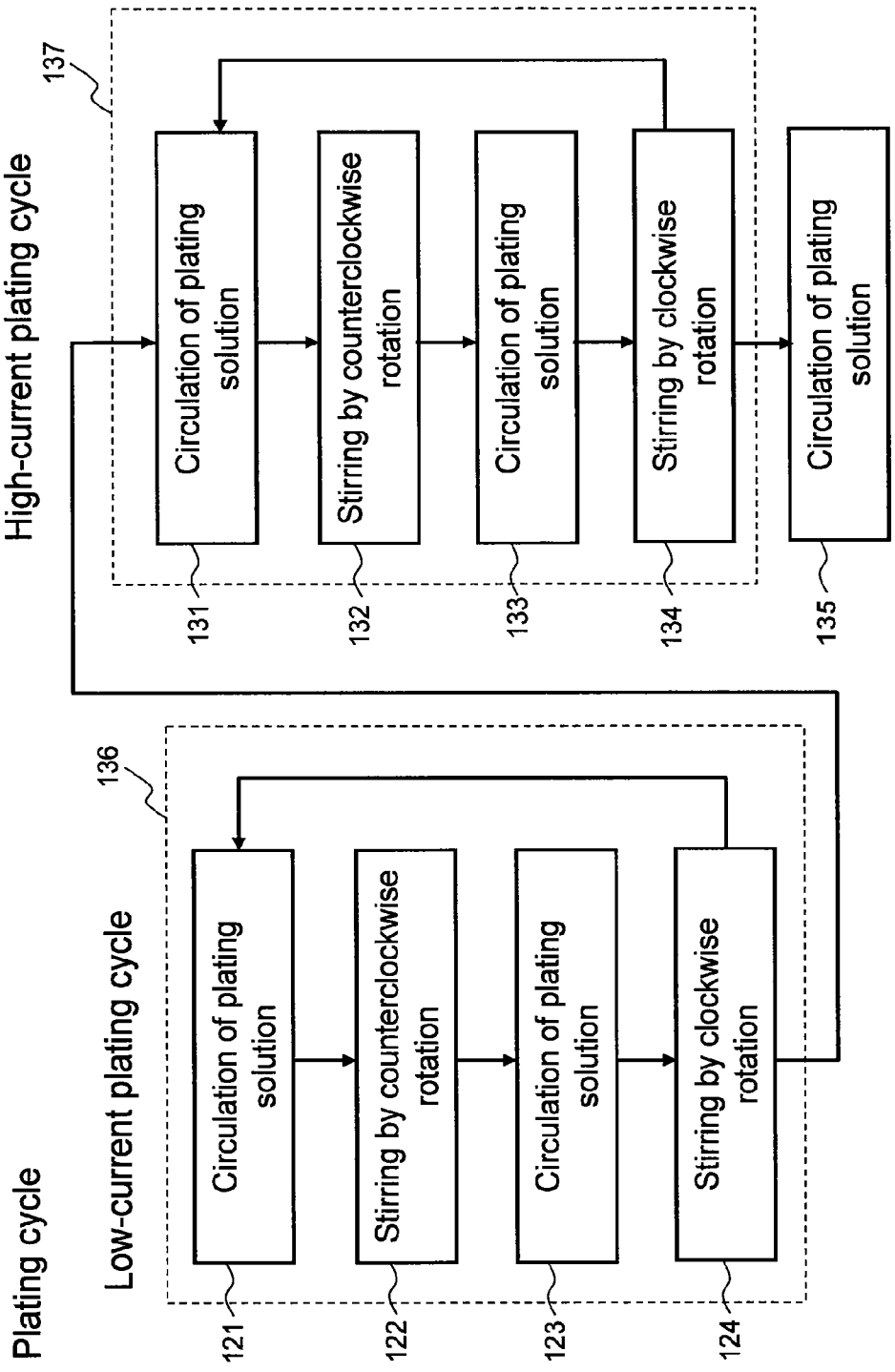
FIG. 20 is a block flow chart specifically showing the flow of a plating step in the entire flow of the gold bump plating process in the manufacturing method of a semiconductor integrated circuit device according to the one embodiment of the invention.

FIG. 17 is a block flow chart showing the entire flow of the gold bump plating process in the manufacturing method of a semiconductor integrated circuit device according to the one embodiment of the invention. FIG. 18 is a block flow chart specifically showing the flow of a cup cleaning step 86 (FIG. 17) in the entire flow of the gold bump plating process in the manufacturing method of a semiconductor integrated circuit device according to the one embodiment of the invention. FIG. 19 is a block flow chart specifically showing the flow of a prior stirring step 90 (FIG. 17) in the entire flow of the gold bump plating process in the manufacturing method of a semiconductor integrated circuit device according to the one embodiment of the invention. FIG. 20 is a block flow chart specifically showing the flow of a plating step 91 (FIG. 17) in the entire flow of the gold bump plating process in the manufacturing method of a semiconductor integrated circuit device according to the one embodiment of the invention. FIGS. 21 to 40 are each a cross-sectional view illustrating the state of the plating cup 24 during each of the steps (some steps may correspond to a plurality of steps because of their repeating factor) illustrated in FIGS. 17 to 20. Based on these drawings, the entire flow of the gold bump plating process which was described roughly in Section 1 will be described in detail.

Figure 21:
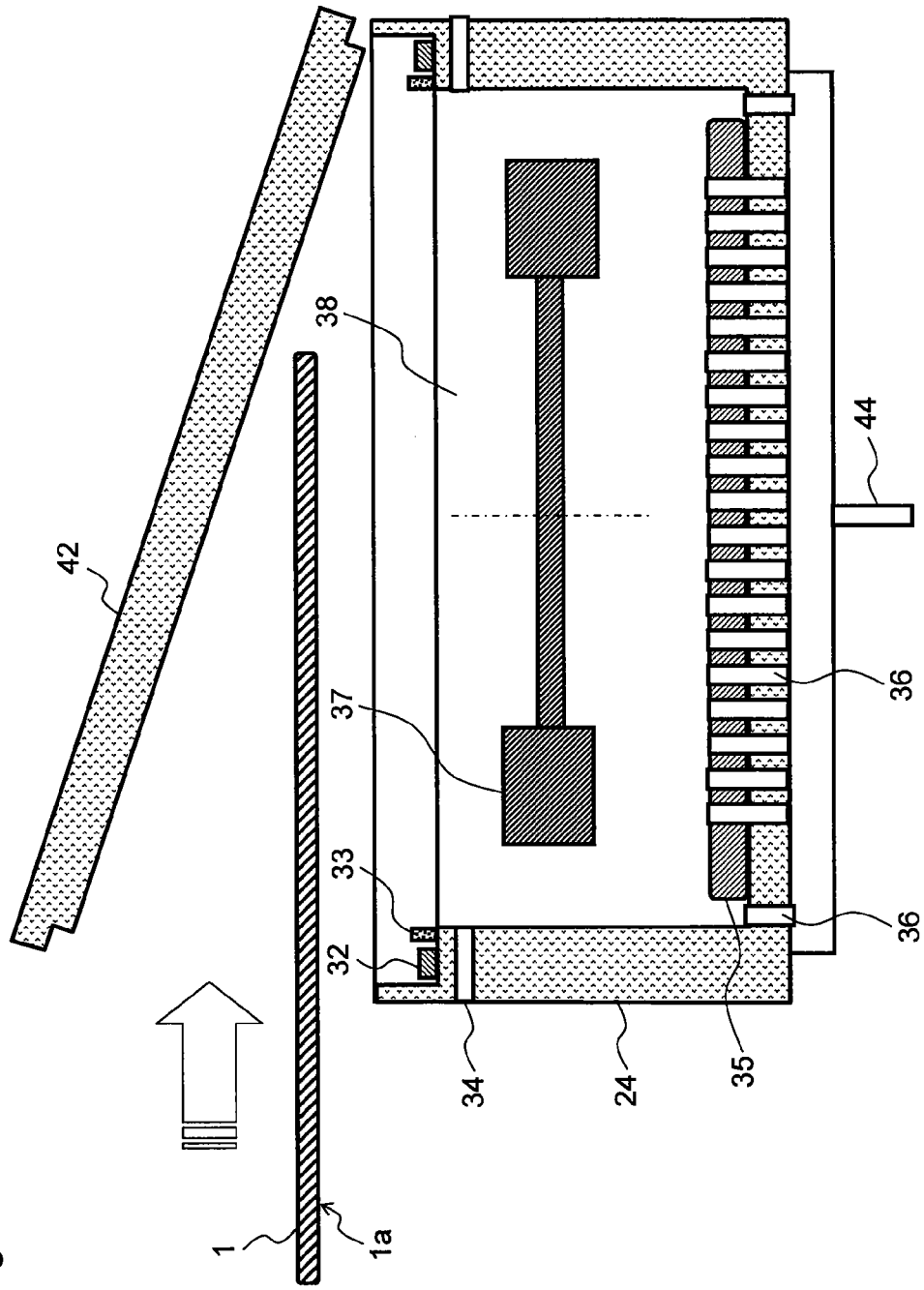
FIG. 21 is a cross-sectional view of a plating cup at the time of wafer loading in the gold bump plating process in the manufacturing method of a semiconductor integrated circuit device according to the one embodiment of the invention.
Figure 22:
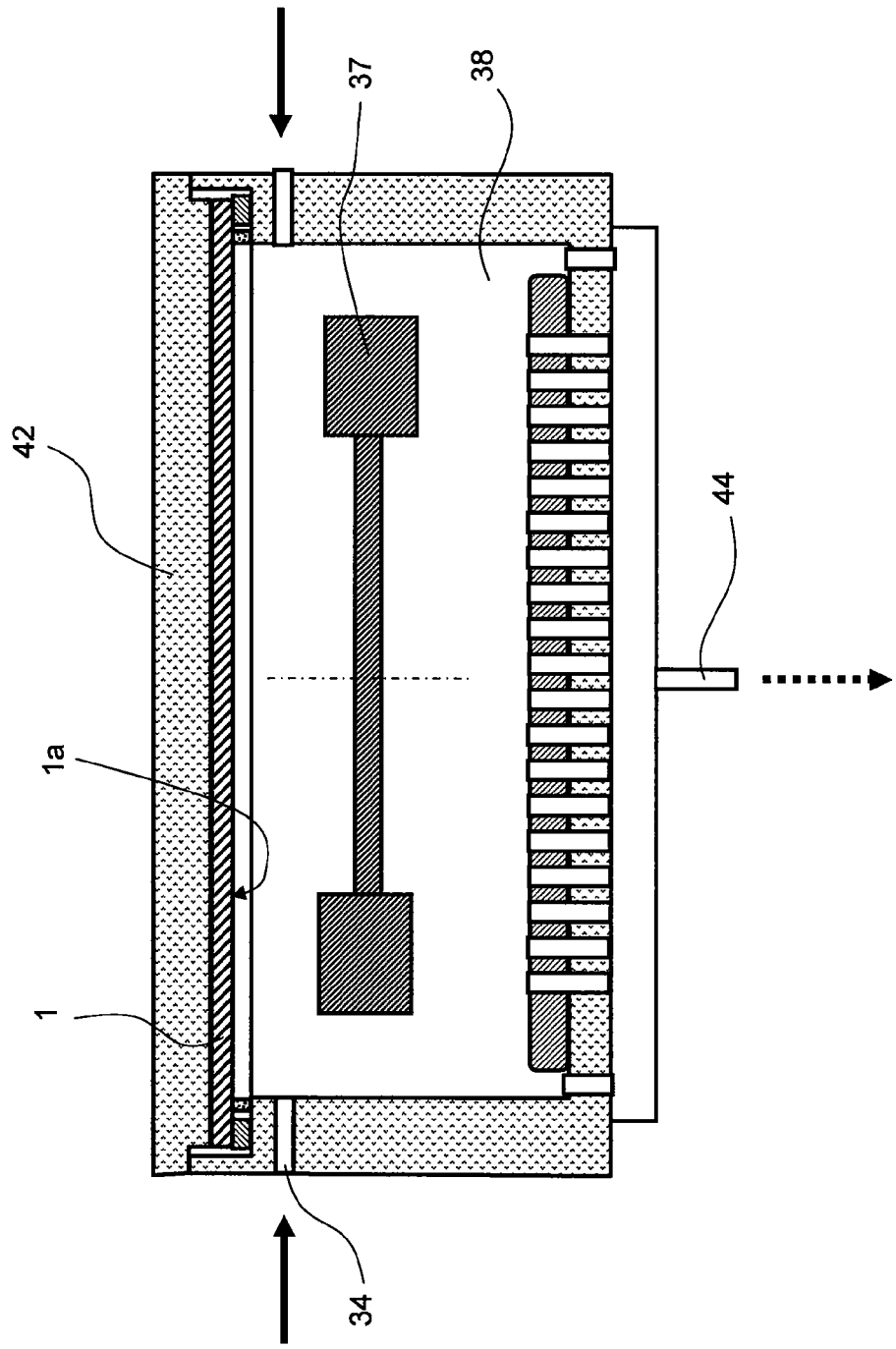
FIG. 22 is a cross-sectional view of the plating cup at the time of starting introduction of a plating solution for cleaning in the gold bump plating process in the manufacturing method of a semiconductor integrated circuit device according to the one embodiment of the invention.
Figure 23:
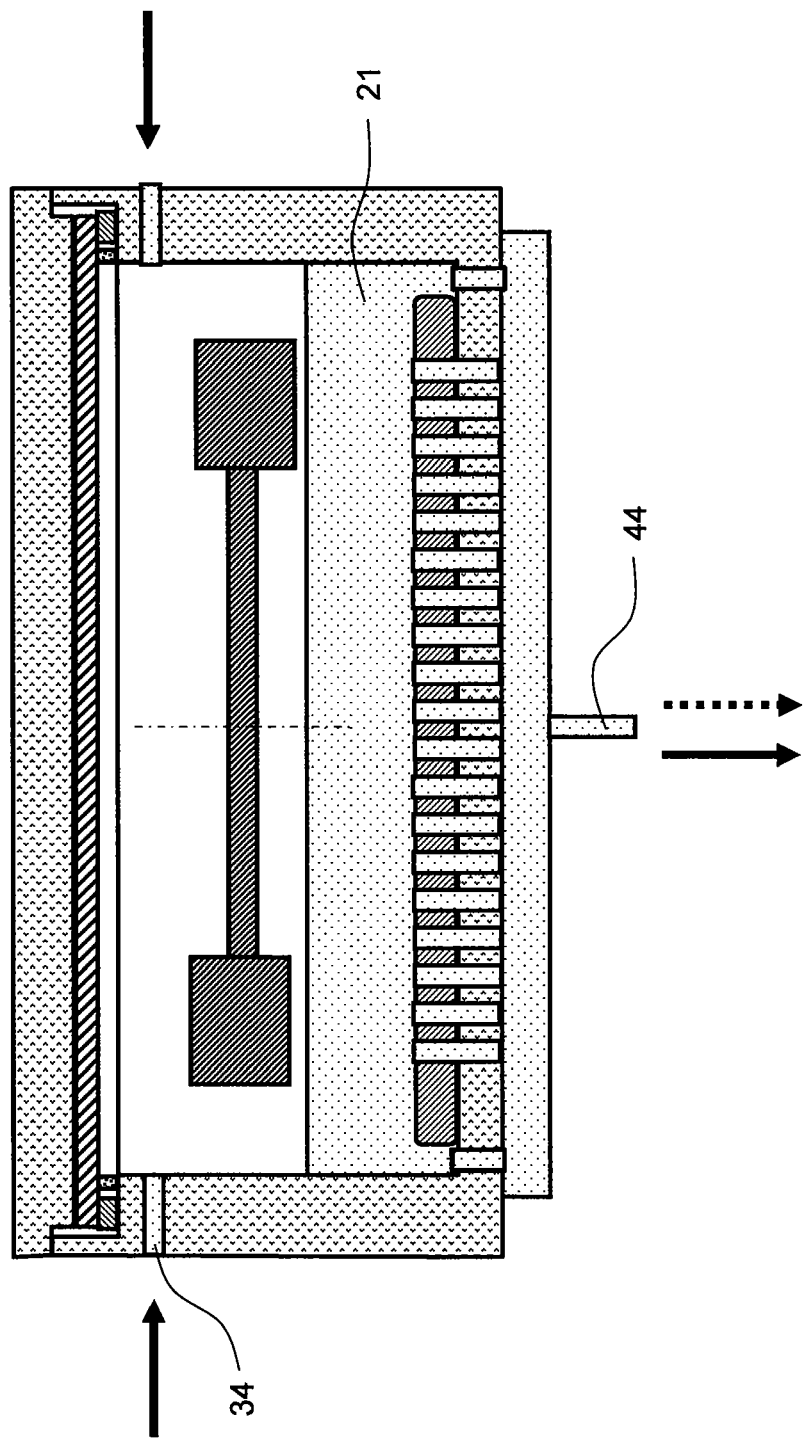
FIG. 23 is a cross-sectional view of the plating cup during the introduction of the plating solution for cleaning in the gold bump plating process in the manufacturing method of a semiconductor integrated circuit device according to the one embodiment of the invention.

As shown in FIG. 17, a plurality of wafers 1 (for example, wafers having a diameter of, for example, 300Ø or 450Ø, or wafers having another diameter) introduced into the plating apparatus are standing ready in the foup (step 81 of standing in foup). Then, the wafers 1 are aligned (alignment step 82) and subjected to wafer surface treatment (wafer surface treatment step 83). Then, as illustrated in FIG. 21, the wafer 1 is introduced into the plating cup 24 (step 84 of introducing into cup; FIG. 17). It should be noted that the plating cup 24 has, at the lower end portion (bottom portion) thereof, a lower-end discharge pipe 44 for feeding the plating solution and like collected from many discharged ports 36. Then, as illustrated in FIG. 22, introduction of the plating solution from an upper side surface introduction port 34 (plating solution introduction port disposed in the vicinity of the wafer set in the plating cup) is started (a step 85 of introducing a plating or cleaning solution; FIG. 17). As illustrated in FIG. 23, the level of the plating solution 21 increases. At this time, a portion of the gas is discharged together with a portion of the plating solution 21 through the lower-end discharge pipe 44. The chemical solution for cleaning and the plating solution for plating have the same composition to enhance the process stability and simplify the structure of the apparatus. If the plating solution can dissolve therein a gold-containing precipitate, it can be used as the chemical solution for cleaning. Accordingly, use of a plating solution itself as a chemical solution for cleaning (cleaning chemical solution) enables to ensure process stability and simplify the structure of the apparatus. It is however possible to optimize the cleaning conditions by using a cleaning chemical solution having a slightly different composition as needed.

Here, a gold sulfite plating solution (an aqueous solution containing sodium gold sulfite as a main component and further containing ethylenediamine, inorganic acid salt, and other trace additives) which is a non-cyanide plating solution causing less environmental problems is used as a plating solution. Examples of it include "Microfab Au 100HM fundamental solution" (product of Electroplating Engineers of Japan Ltd). It is needless to say that a cyanide plating solution can be used if due consideration is given to the environment.

Figure 24:
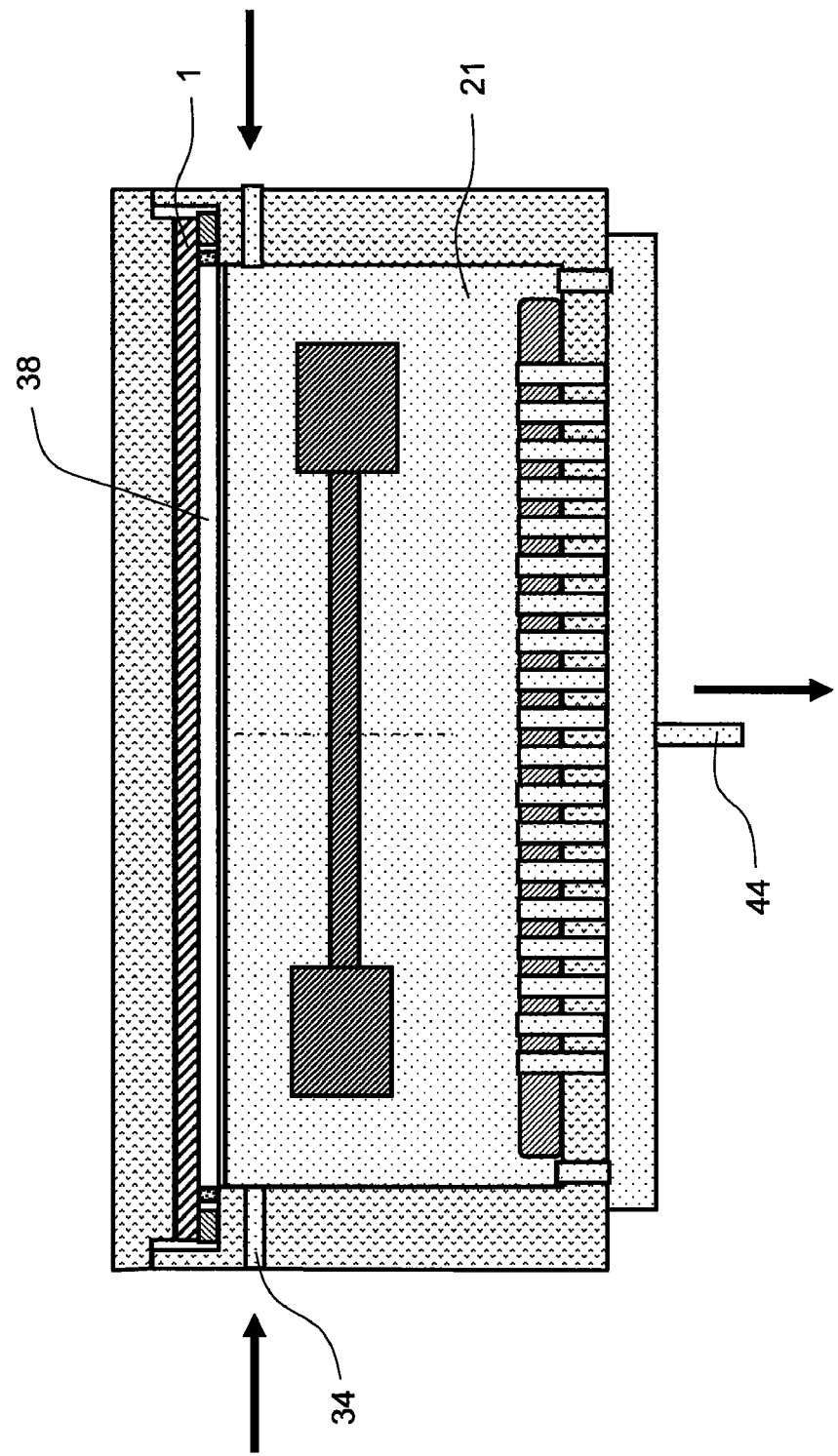
FIG. 24 is a cross-sectional view of the plating cup at the time of completing the introduction of the plating solution for cleaning in the gold bump plating process in the manufacturing method of a semiconductor integrated circuit device according to the one embodiment of the invention.
Figure 25:
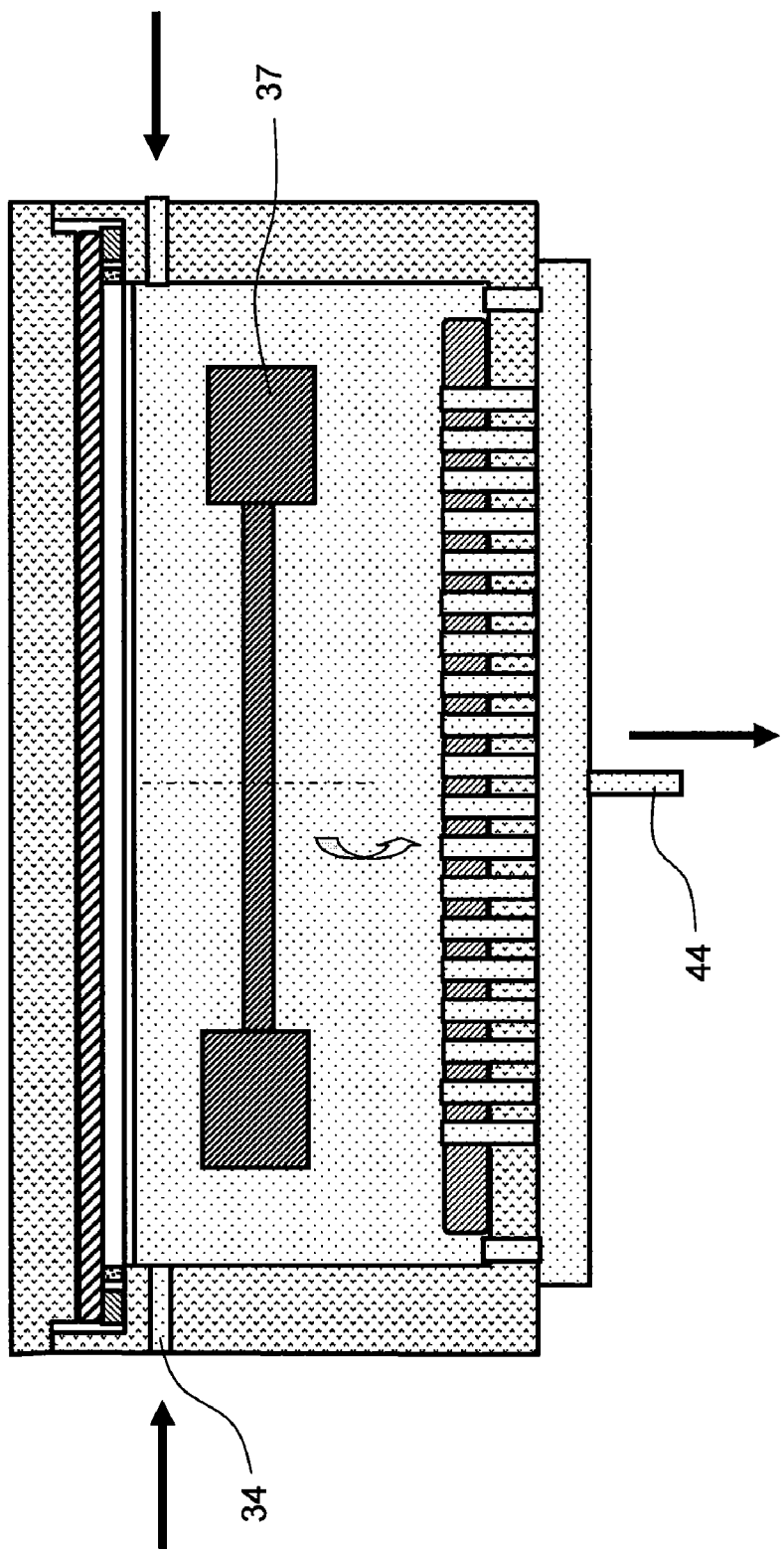
FIG. 25 is a cross-sectional view of the plating cup at the time of counterclockwise stirring for cleaning in the gold bump plating process in the manufacturing method of a semiconductor integrated circuit device according to the one embodiment of the invention.
Figure 26:
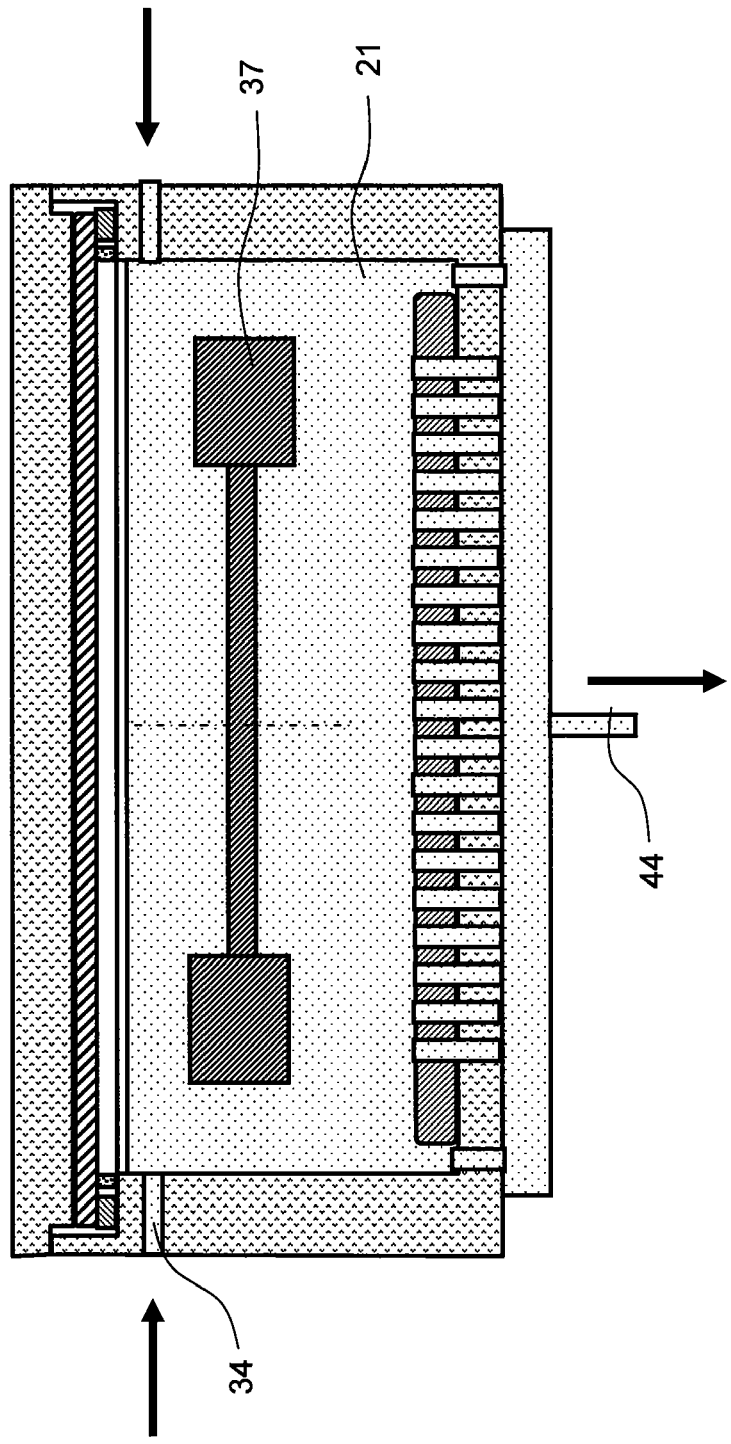
FIG. 26 is a cross-sectional view of the plating cup at the time of circulation of the plating solution (at the time of rotation switching) for cleaning in the gold bump plating process in the manufacturing method of a semiconductor integrated circuit device according to the one embodiment of the invention.
Figure 27:
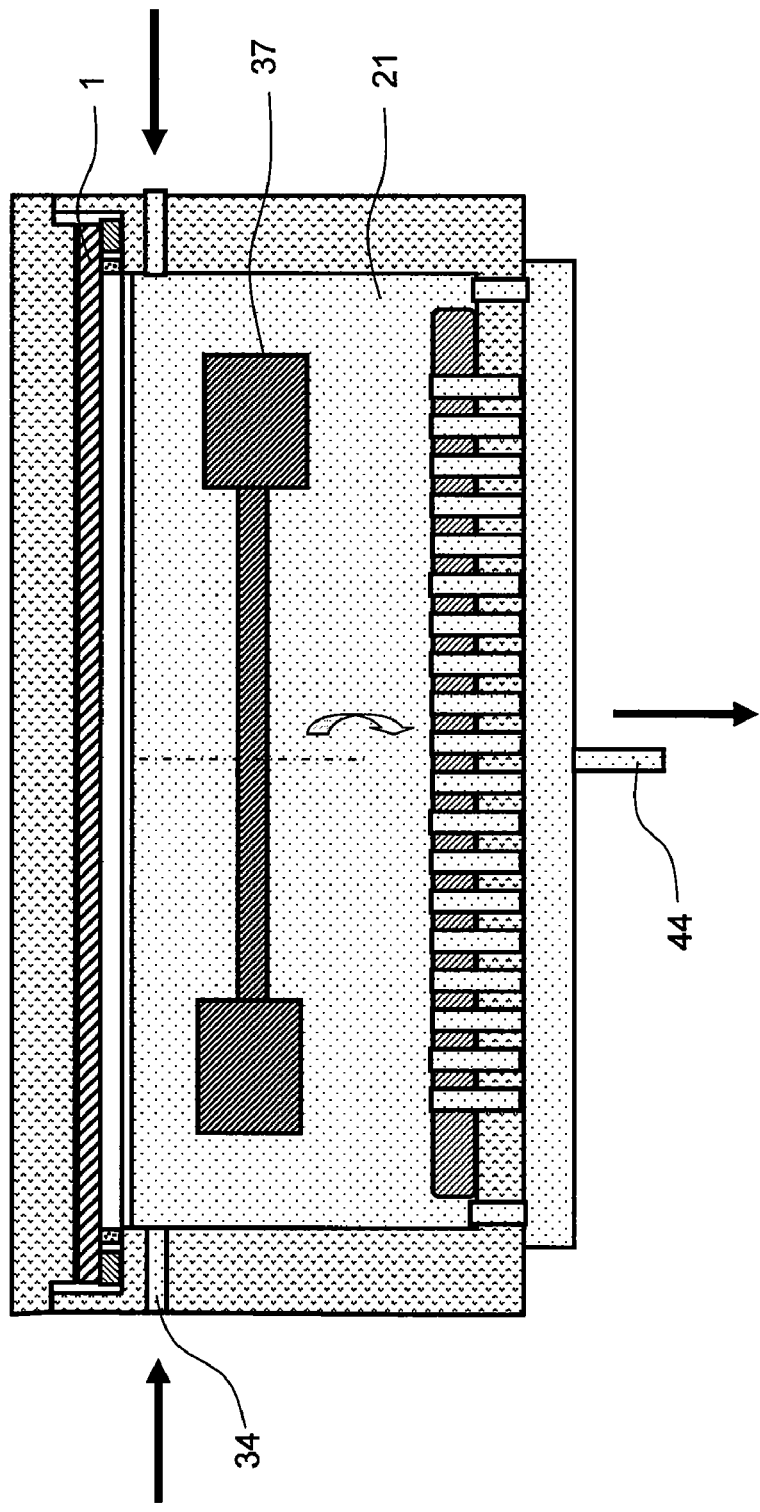
FIG. 27 is a cross-sectional view of the plating cup at the time of clockwise stirring for cleaning in the gold bump plating process in the manufacturing method of a semiconductor integrated circuit device according to the one embodiment of the invention.
Figure 28:
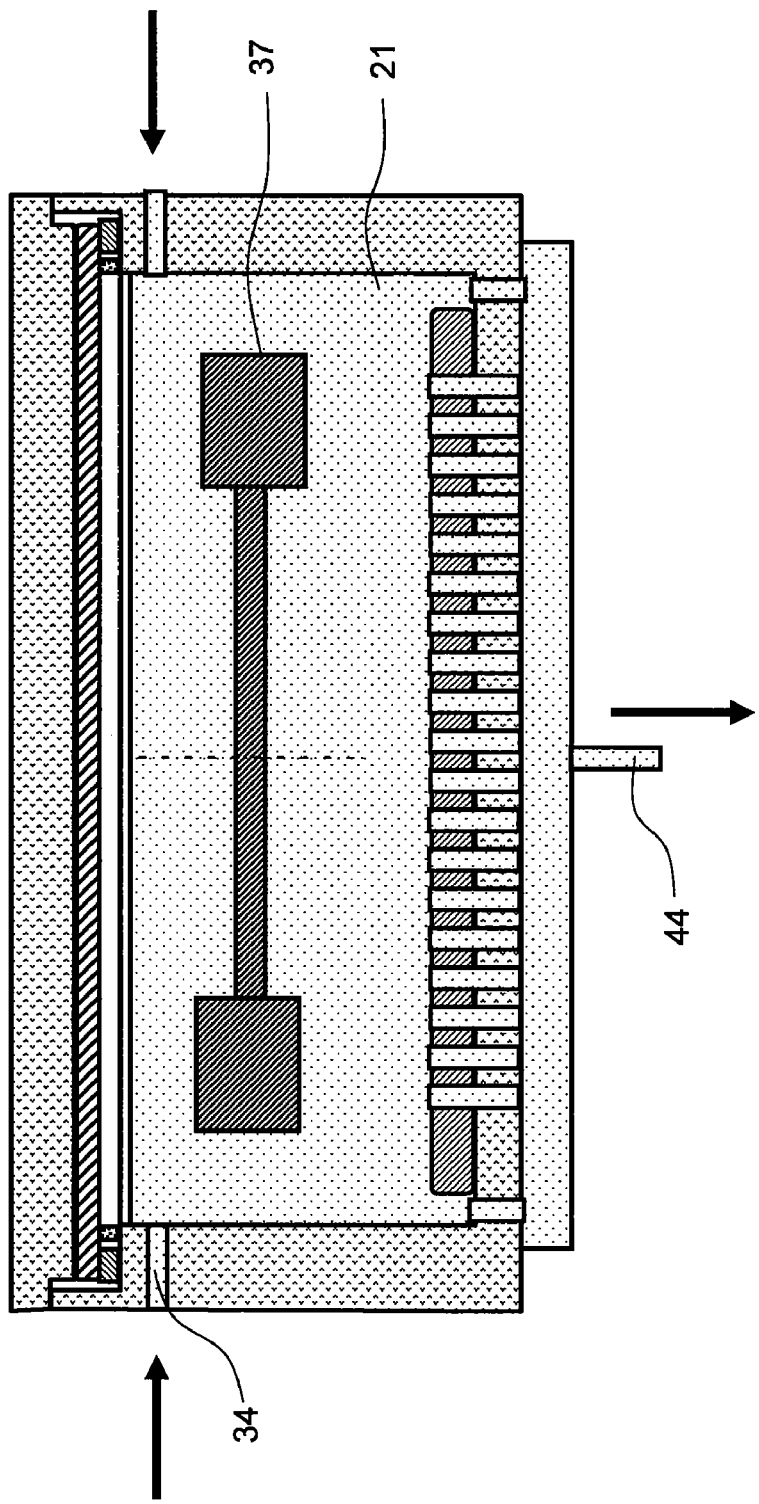
FIG. 28 is a cross-sectional view of the plating cup at the time of circulation of the plating solution (at the time of completion of cleaning) for cleaning in the gold bump plating process in the manufacturing method of a semiconductor integrated circuit device according to the one embodiment of the invention.

As illustrated in FIG. 24, as soon as the plating tank 38 is almost filled with the plating solution 21 (cleaning solution or chemical solution), the plating solution circulates (plating-solution circulation sub-step 101; FIG. 18) and the cup cleaning step 86 (FIG. 17) starts. It takes about 60 seconds for the first cycle of the plating-solution circulation sub-step 101 and about 1 second for the subsequent cycles. Then, as illustrated in FIG. 25, stirring of the plating solution 21 is performed by counterclockwise rotation of the stirrer 37 under a circulation state under which the plating solution is introduced from the upper side surface introduction port 34 and discharged from the lower-end discharge pipe 44 (counterclockwise rotation stirring substep 102; FIG. 18). At this time, an electric current for plating has not yet been applied. The rotation speed of the stirrer 37 is for example about 50 rpm. The rotation time is about 29 seconds. Then, the counterclockwise rotation of the stirrer 37 is terminated and the plating tank returns to a circulation state (plating solution circulation substep 103). This substep continues for about 1 second. As illustrated in FIG. 27, the plating solution 21 is stirred by the clockwise rotation of the stirrer 37 (clockwise rotation stirring sub-step 104; FIG. 18). The rotation speed of the stirrer 37 is, for example, 50 rpm. The rotation time is about 29 seconds. Then, as illustrated in FIG. 18, a cleaning cycle 106 from the plating solution circulation sub-step 101 to the clockwise rotational stirring sub-step 104 is repeated as needed. The repeating frequency from about 5 times to about 10 times is usually preferred. After the cleaning cycle is repeated, the plating tank enters a plating solution circulation sub-step 105 (FIG. 18) for completing the cleaning step and it takes, for example, about 60 seconds.

Figure 30:
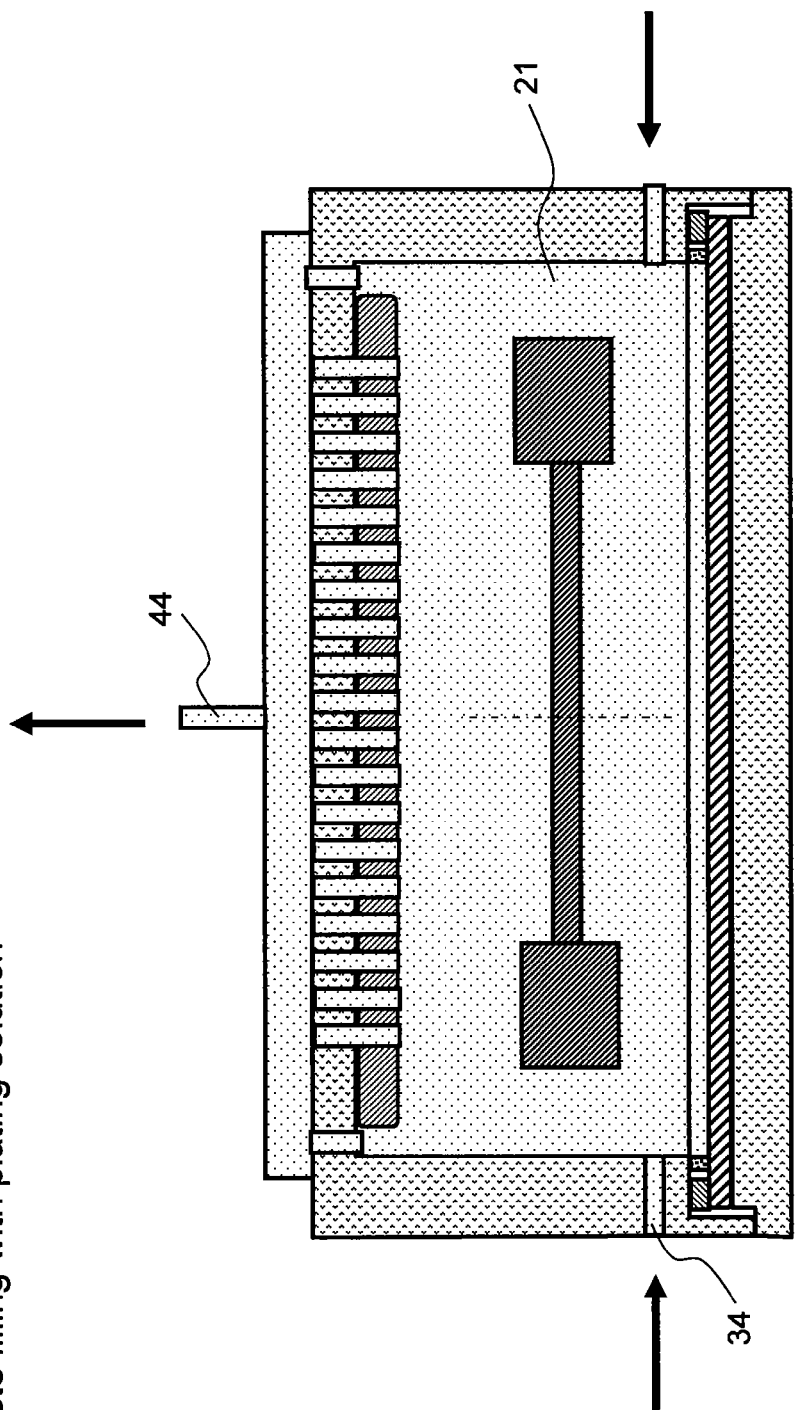
FIG. 30 is a cross-sectional view of the plating cup at the time of complete filling with the plating solution for plating (including prior stirring) in the gold bump plating process in the manufacturing method of a semiconductor integrated circuit device according to the one embodiment of the invention.
Figure 31:
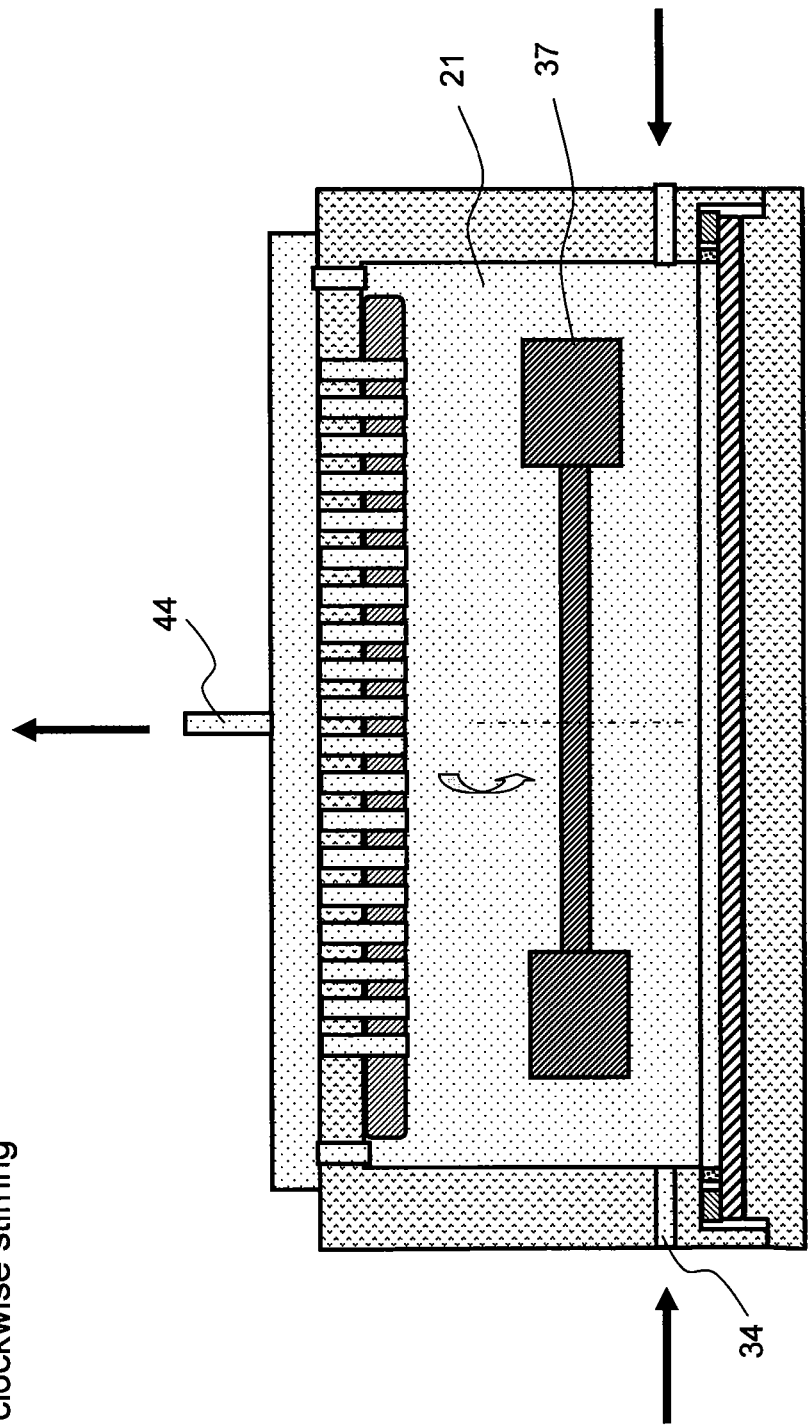
FIG. 31 is a cross-sectional view of the plating cup at the time of counterclockwise stirring for plating (including prior stirring) in the gold bump plating process in the manufacturing method of a semiconductor integrated circuit device according to the one embodiment of the invention.
Figure 32:
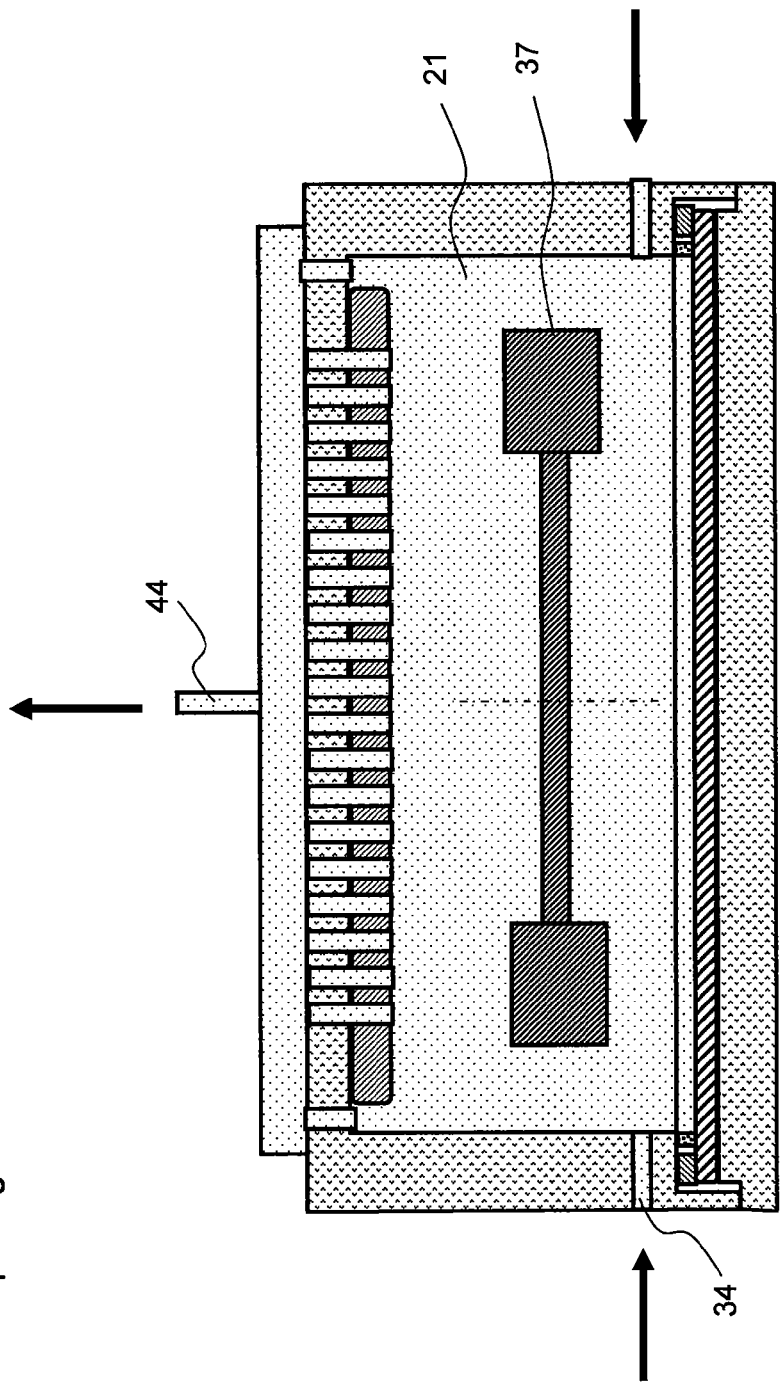
FIG. 32 is a cross-sectional view of the plating cup at the time of circulating the plating solution (at the time of rotation switching) for plating (including prior stirring) in the gold bump plating process in the manufacturing method of a semiconductor integrated circuit device according to the one embodiment of the invention.
Figure 33:
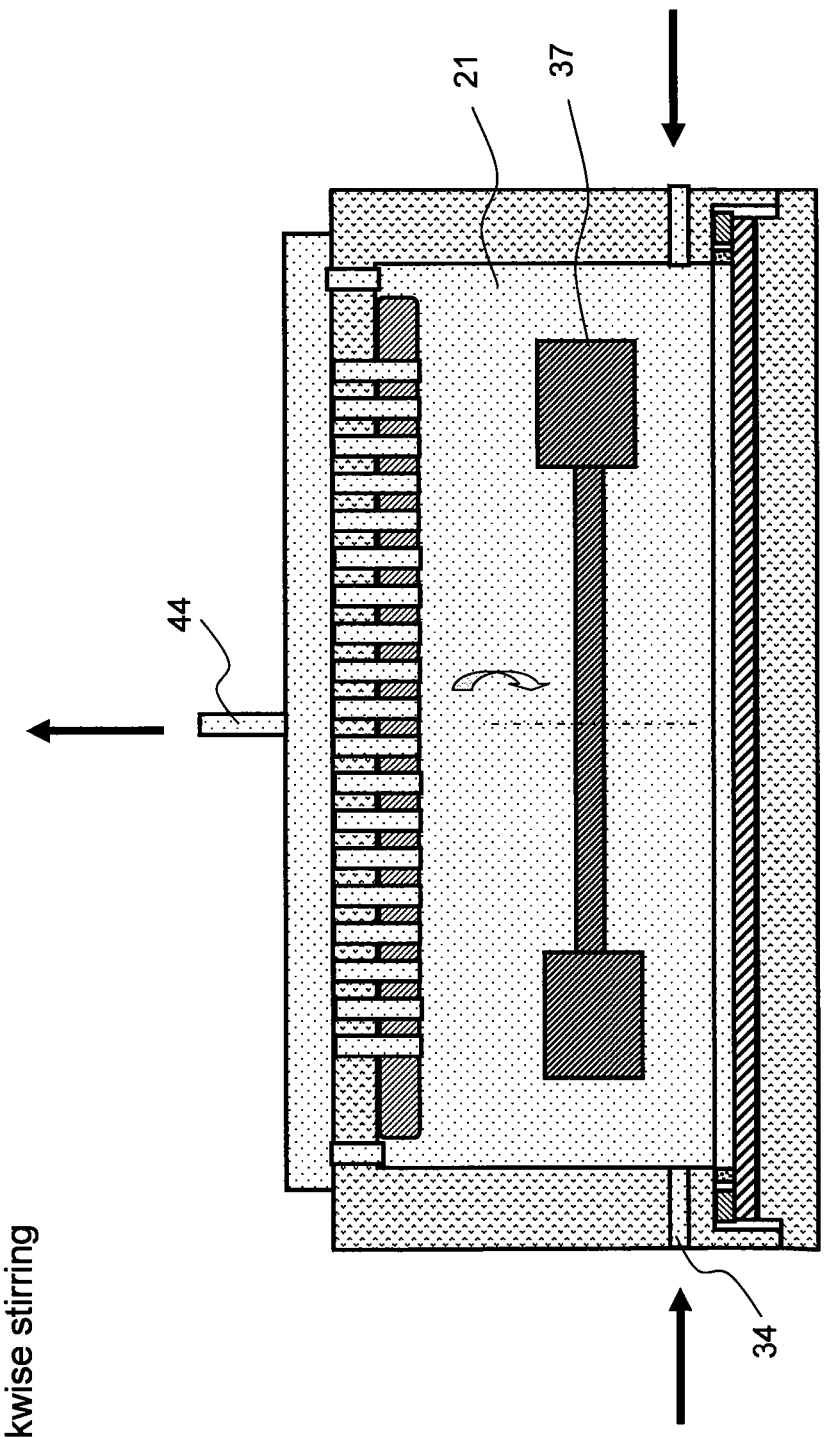
FIG. 33 is a cross-sectional view of the plating cup at the time of clockwise stirring for plating (including prior stirring) in the gold bump plating process in the manufacturing method of a semiconductor integrated circuit device according to the one embodiment of the invention.
Figure 34:
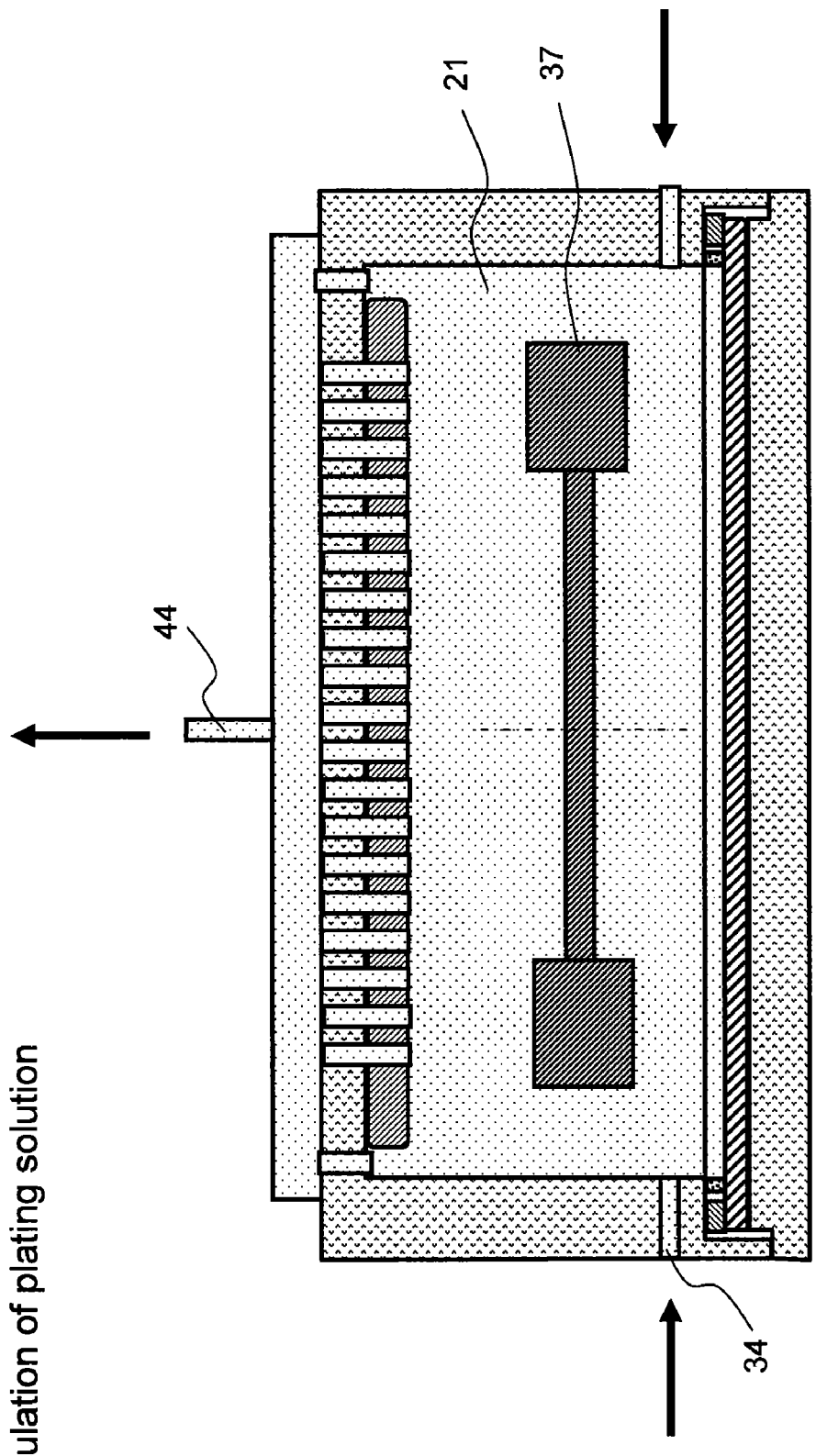
FIG. 34 is a cross-sectional view of the plating cup at the time of circulation of the plating solution (at the time of completion of prior stirring or plating) for plating (including prior stirring) in the gold bump plating process in the manufacturing method of a semiconductor integrated circuit device according to the one embodiment of the invention.

After the cup is cleaned, the circulation of the plating solution is terminated (FIG. 28), followed by a cup inversion step 88 (FIG. 17). As illustrated in FIG. 29, the cup is inverted by 180 degree (upside down). The cup may be inverted under a circulation state, which however needs an apparatus having a complicated structure. As illustrated in FIG. 30, the plating solution 21 is introduced from the upper side surface introduction port 34 (as described above, with regard to the introduction port and discharge port, the opening end of the cup is designated as "upper" portion of the cup irrespective of the direction of gravity because a name change depending on the erection or inversion of the cup may cause confusion) while the cup is inverted and circulation of the plating solution is started again. The gas inside the cup is pressed up by the plating solution 21 and discharged in good order (complete filling with the plating solution) from the lower-end discharge pipe 44 (in normal sense, the discharge pipe is placed at the upper end because it exists at the bottom of the inverted cup) so that there is less possibility of air bubbles remaining in the cup. As illustrated in FIG. 30, when the cup is filled with the plating solution 21 completely (100%), a plating solution circulation sub-step 111 (FIG. 19) of the prior stirring step 90 (FIG. 17) for thoroughly mixing the plating solution 21 starts. At this stage, an electric current for plating has not yet been supplied. Then, by the counterclockwise rotation of the stirrer 37 (FIG. 31), the plating solution 21 is stirred (counterclockwise rotation stirring sub-step 112; FIG. 19). The rotation speed of the stirrer is for example about 50 rpm. The rotation time is, for example, about 29 seconds. After the rotation of the stirrer 37 is terminated, a circulation sub-step 113 (FIG. 19) starts as illustrated in FIG. 32. This sub-step is performed for, for example, about 1 second. Then, as illustrated in FIG. 33, the plating solution 21 is stirred by the clockwise rotation of the stirrer 37 (clockwise rotation stirring sub-step 114; FIGS. 19 and 33). The rotation speed of the stirrer 37 is, for example, about 50 rpm. The rotation time is, for example, about 29 seconds. After the rotation of the stirrer 37 is terminated again, a circulation sub-step 121 (FIG. 20) of the plating step 91 (FIG. 17) starts as illustrated in FIG. 34. This step is performed for, for example, about 1 second.

As illustrated in FIG. 20, the plating step 91 (FIG. 17) can be divided into a low-current plating cycle 136 (for example, applied dc voltage: 5V and current: 0.2 A) of a first stage and a high current plating cycle 137 (for example, applied dc voltage: 5V and current: 0.7 A) of a second stage. Such a process is called "two-stage plating process". It is employed in order to avoid generation of air bubbles which may otherwise occur by plating at a high current from the start. In this embodiment, plating treatment is performed with the face of the wafer up so that mixing of air bubbles (mixing of external air bubbles) occurs slightly even without using this two-stage process, but use of it can reduce generation of air bubbles (internal air bubbles) from the inside of the solution. For example, it is desired to carry out plating to a plating thickness of from about 0.5 to 1 µm by the low-current plating cycle 136 when an intended plating thickness is about 15 µm in total. If there is enough time, the plating time can be prolonged further.

Subsequent to the circulation sub-step 121 (FIG. 20), the plating solution 21 is stirred by the counterclockwise rotation of the stirrer 37 (counterclockwise rotation stirring sub-step 122; FIG. 20). During this sub-step, a low plating current is applied (a plating current is applied for the first time at this stage). The rotation speed of the stirrer 37 is, for example, about 120 rpm. The rotation time is, for example, 59 seconds. Then, with the termination of the stirrer 37, a circulation sub-step 123 (FIG. 20) starts as illustrated in FIG. 32. During this sub-step, the plating current is turned off. This sub-step is performed for, for example, about 1 second. Then, as illustrated in FIG. 33, the plating solution 21 is stirred by the clockwise rotation of the stirrer 37 (clockwise rotation stirring sub-step 124; FIG. 20). During this sub-step, a low plating current is applied. The rotation speed of the stirrer 37 is, for example, about 120 rpm. The rotation time is, for example, 59 seconds. This low-current plating cycle 136 is repeated as needed as illustrated in FIG. 20. It is repeated appropriately, for example, twice to six times.

After the completion of the low-current plating cycle 136, the stirrer 37 is terminated again and a plating-solution circulation sub-step 131 of the high-current plating cycle 137 (FIG. 20) starts. During this sub-step, an electric current for plating is turned off. This sub-step is performed, for example, about 1 second. Then, as illustrated in FIG. 31, the plating solution 21 is stirred by the counterclockwise rotation of the stirrer 37 (counterclockwise rotation stirring sub-step 132; FIG. 20). During this sub-step, a high plating current is applied. The rotation speed of the stirrer is, for example, about 120 rpm. The rotation time is, for example, 59 seconds. With the termination of the stirrer 37, a circulation sub-step 133 (FIG. 20) starts as illustrated in FIG. 32. During this sub-step, the plating current is turned off. This sub-step is performed for, for example, about 1 second. Then, as illustrated in FIG. 33, the plating solution 21 is stirred by the clockwise rotation of the stirrer 37 (clockwise rotation stirring sub-step 134; FIG. 20). During this sub-step, a high plating current is applied. The rotation speed of the stirrer 37 is, for example, about 120 rpm. The rotation time is, for example, 59 seconds. This high-current plating cycle 137 is repeated as needed as illustrated in FIG. 20. It is repeated appropriately, for example, 10 times to 15 times to give a plating thickness of about 15 µm in total. When the plating current is turned off and the stirrer 37 is terminated, the plating cycle finishes and as illustrated in FIG. 34, a circulation sub-step 135 (FIG. 20) starts. This sub-step is performed for, for example, about 60 seconds. It should be noted that the final cycle of the plating cycle may be terminated in the middle of the cycle, depending on the plating thickness.

Figure 35:
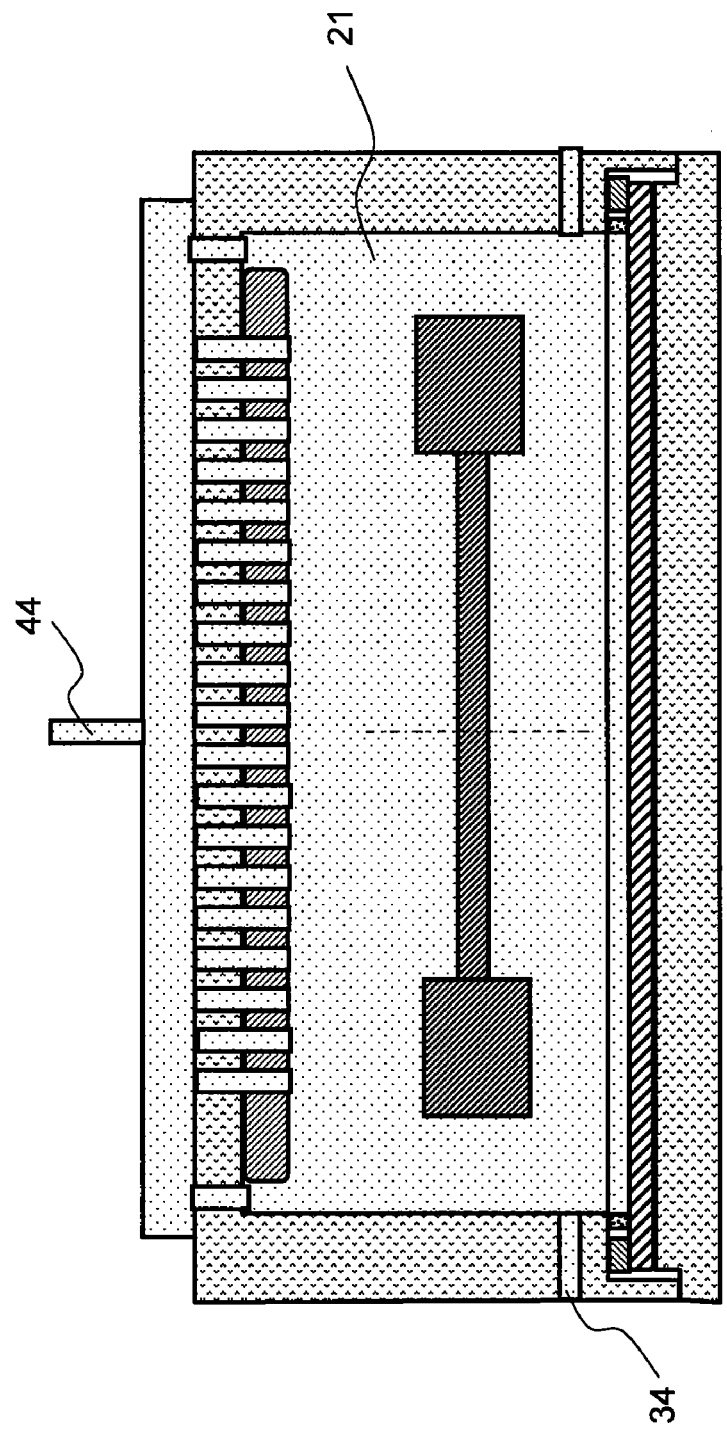
FIG. 35 is a cross-sectional view of the plating cup at the time of circulation of the plating solution after completion of the plating in the gold bump plating process in the manufacturing method of a semiconductor integrated circuit device according to the one embodiment of the invention.
Figure 36:
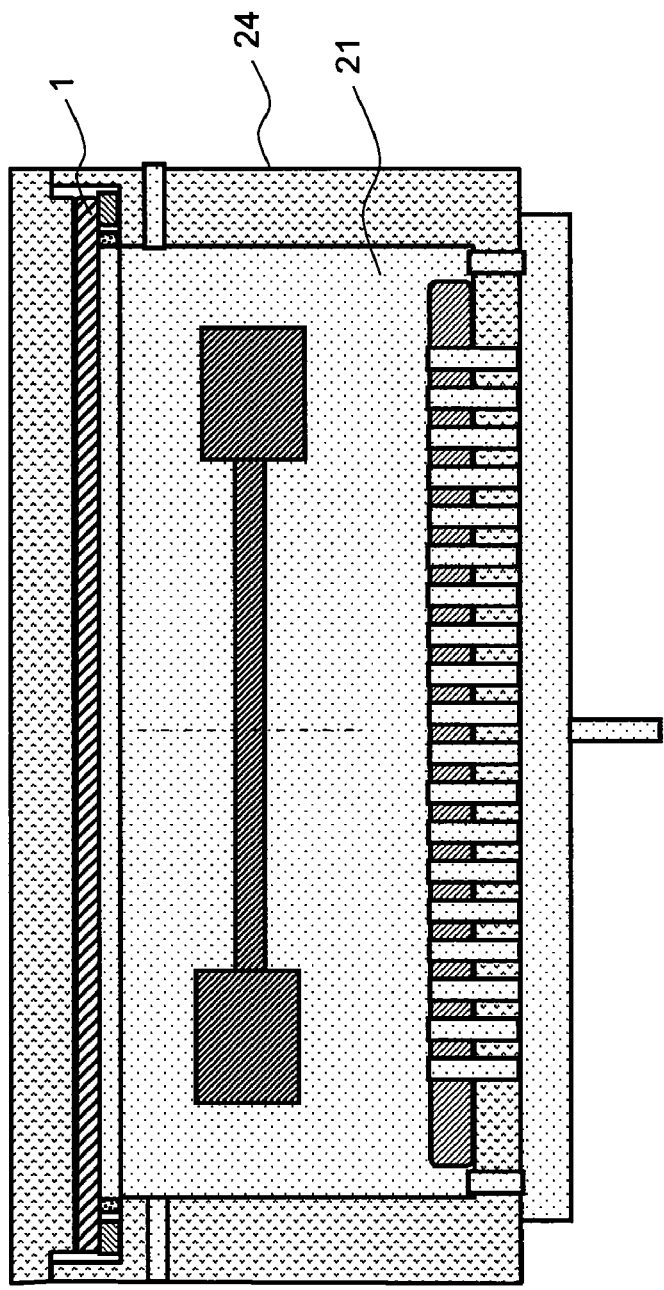
FIG. 36 is a cross-sectional view of the plating cup at the time of re-inversion of the plating cup after completion of the plating in the gold bump plating process in the manufacturing method of a semiconductor integrated circuit device according to the one embodiment of the invention.
Figure 37:
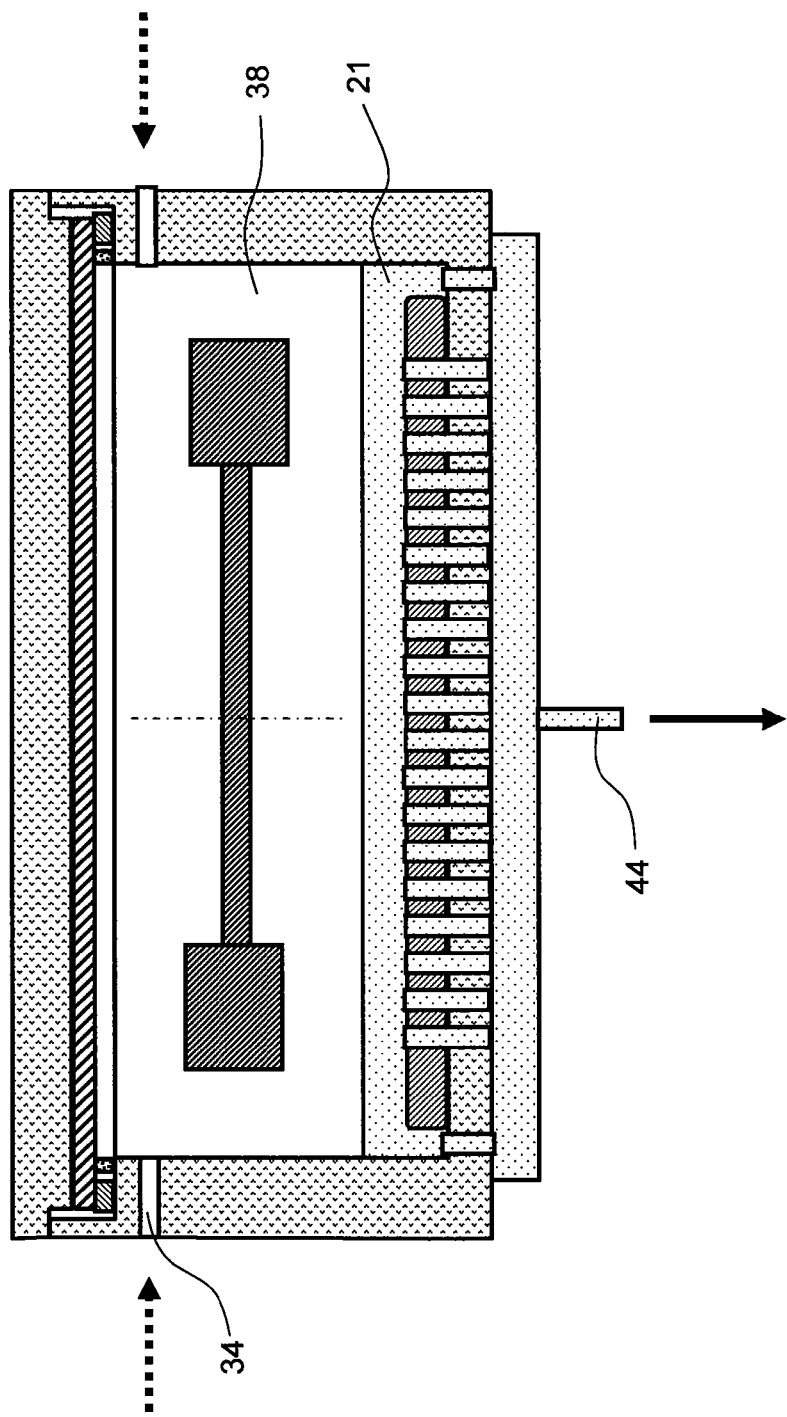
FIG. 37 is a cross-sectional view of the plating cup during discharge of the plating solution after completion of the plating in the gold bump plating process in the manufacturing method of a semiconductor integrated circuit device according to the one embodiment of the invention.
Figure 38:
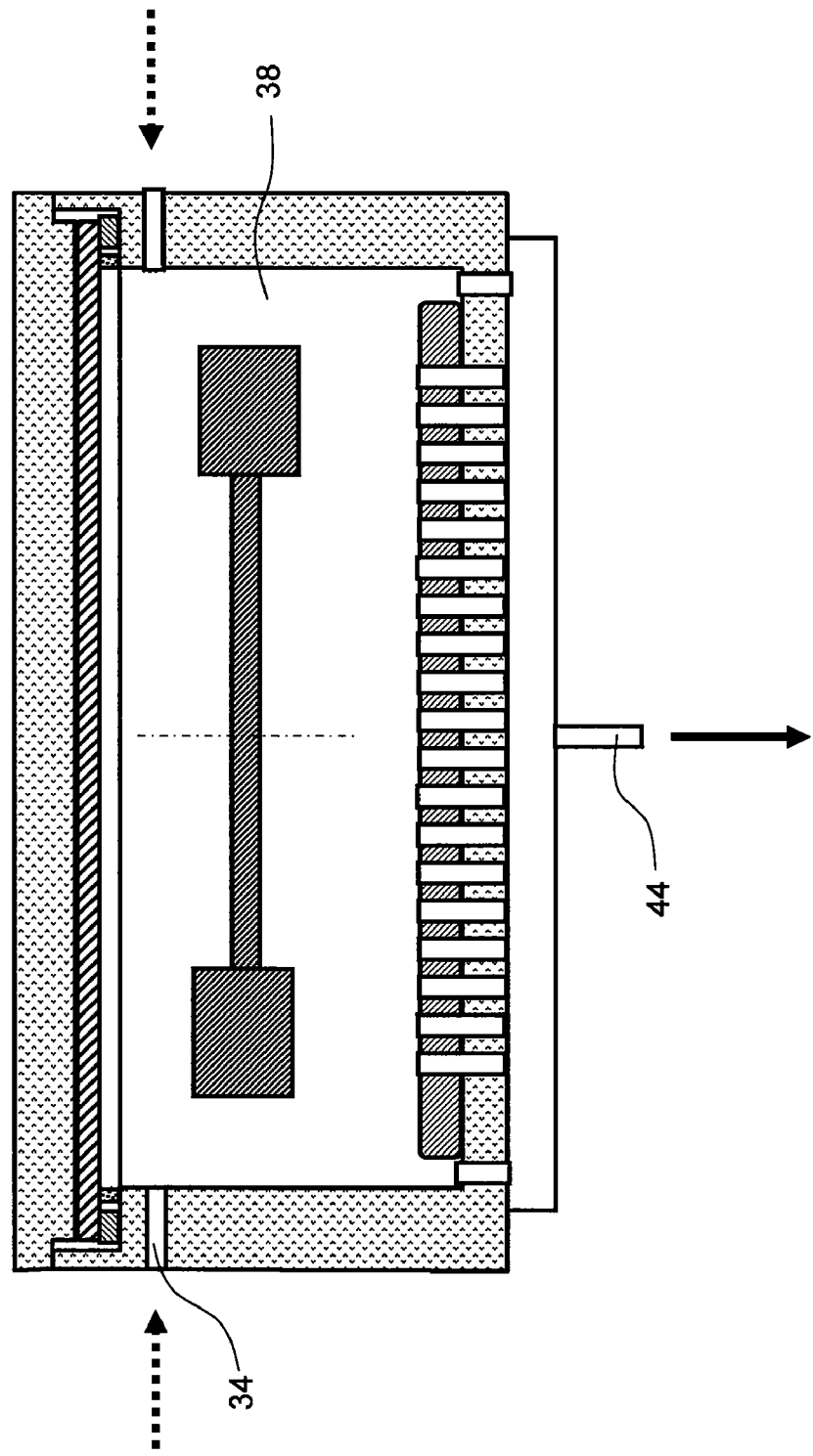
FIG. 38 is a cross-sectional view of the plating cup during discharge of the plating solution after completion of the plating in the gold bump plating process in the manufacturing method of a semiconductor integrated circuit device according to the one embodiment of the invention.
Figure 39:
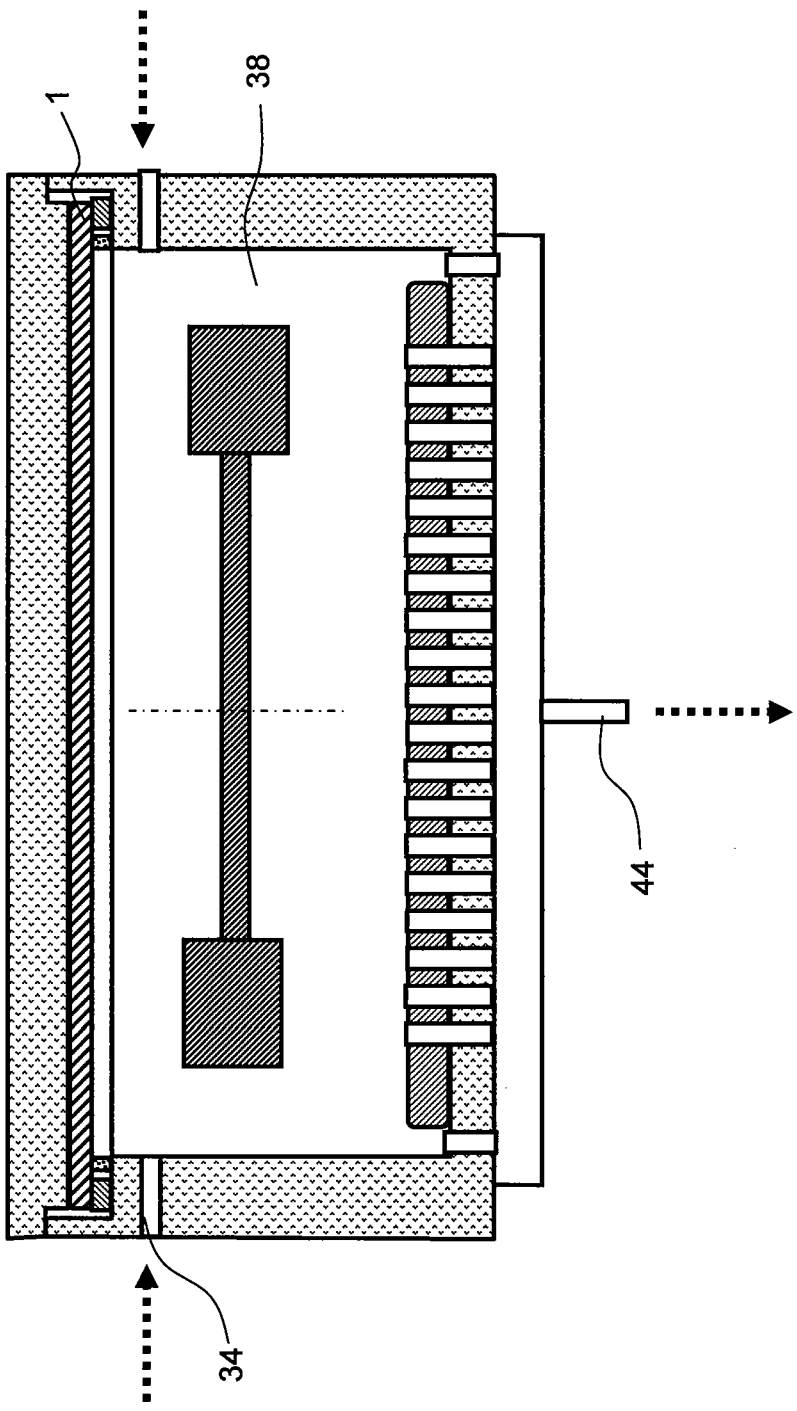
FIG. 39 is a cross-sectional view of the plating cup at the time of gas purge after completion of the plating in the gold bump plating process in the manufacturing method of a semiconductor integrated circuit device according to the one embodiment of the invention.
Figure 40:
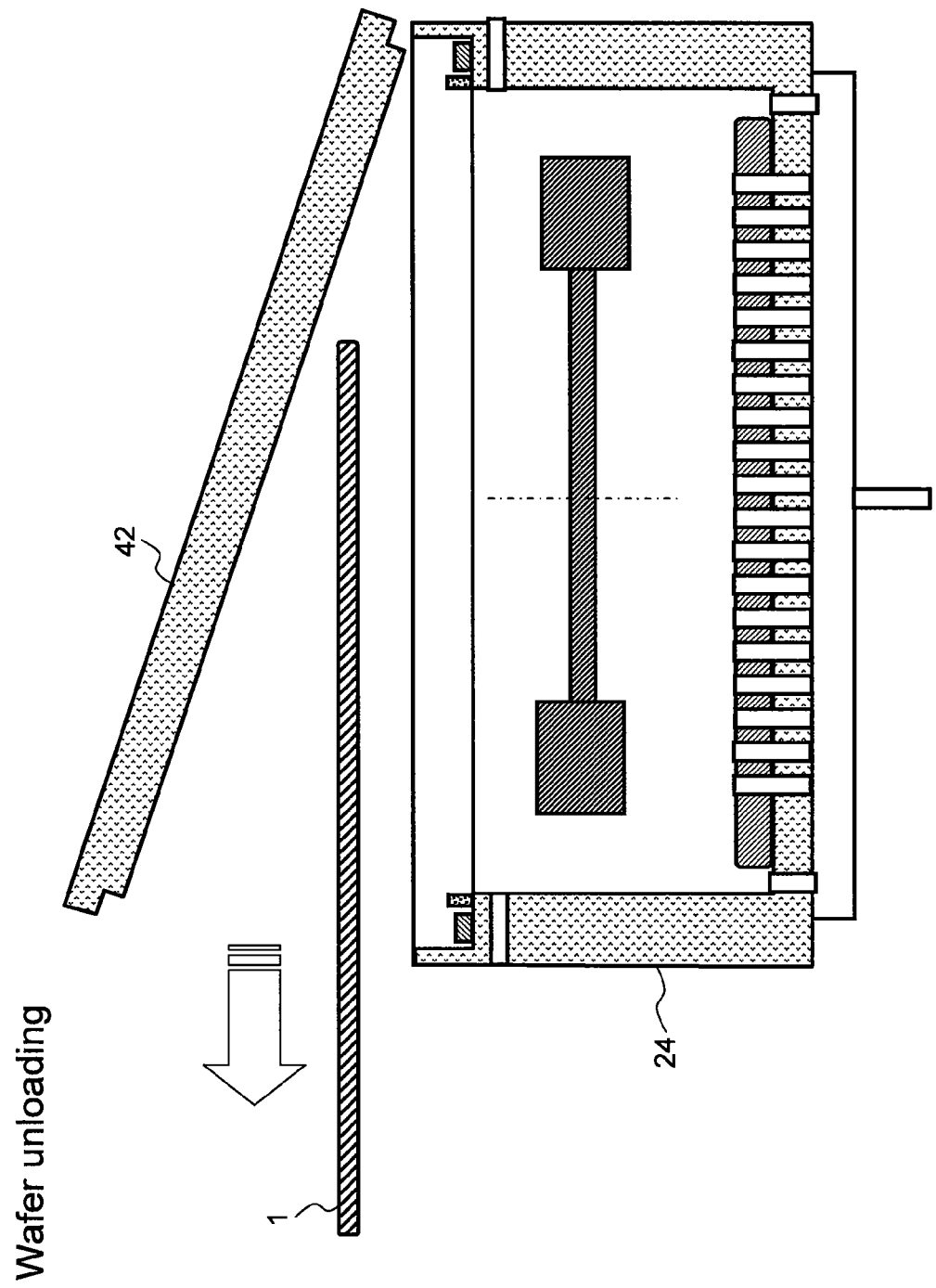
FIG. 40 is a cross-sectional view of the plating cup at the time of wafer unloading after completion of the plating in the gold bump plating process in the manufacturing method of a semiconductor integrated circuit device according to the one embodiment of the invention.

Then, as illustrated in FIG. 35, the circulation of the plating solution 21 is also terminated. As illustrated in FIG. 36, the plating cup 24 is inverted again and restores an erected state (cup re-inversion step 92; FIG. 17). As illustrated in FIG. 37, the plating solution 21 is then discharged from the lower-end discharge pipe 44. The reason why the plating solution is discharged after re-inverting the cup into an erected state is because the plating solution is poured down to prevent attachment of foreign matters and the like to the wafer and promptly discharge them from the bottom portion of the cup. A nitrogen gas is supplied to the plating tank 38 through the upper side surface introduction port 34 to offset the decrease of the plating solution 21 (plating solution discharging step 93; FIG. 17). Then, as illustrated in FIG. 38, the plating solution 21 is completely discharged from the plating tank 38. As illustrated in FIG. 39, a nitrogen purge step 94 (FIG. 17) for replacing the atmosphere inside the plating tank 38 with nitrogen is performed by feeding a nitrogen gas to the plating tank 38 through the upper side surface introduction port 34 and discharging it from the lower-end discharge pipe 44. Finally, the lid 42 of the plating cup 24 is opened and the wafer 1 is unloaded (wafer unloading step 95; FIG. 17).

5. Description of Another Step or Another Structure of the Apparatus

The apparatus employed in this embodiment has a system of carrying out plating while inverting a plating cup, but it may have a plating system with the face of the wafer down without inverting the cup. In this case, the cup inversion step 74 and the cup re-inversion step 77 in FIG. 1 are eliminated (corresponding to the cup inversion step 88 and cup re-inversion step 92 in FIG. 17). Optimization of the attitude of the plating cup (direction in a space, that is, direction of the device surface of the wafer) in each of the cleaning step and main plating step (resulting in a difference in the attitude of the plating cup between these steps) enables highly reliable and highly flat bump plating. As the attitude of the plating cup, only the erected cup and inverted cup are exemplified, but it is needless to say that the cup may be slanted lightly.

In addition, an example of performing the cup cleaning step 72 of FIG. 1 by setting (or loading) a product wafer 1 to be plated in the plating cup 24 was described, but it is also possible to carry out the cup cleaning step 72 not by setting the wafer 1 but only closing the lid 42 or setting a dummy wafer instead of the product wafer 1. This method of carrying out the cup cleaning step without setting the product wafer 1 may have an advantage that during this period, the product wafer can be subjected to another treatment. Even if the product wafer 1 is used, payment of enough attention to treatment procedures or allocation of time enables treatment without substantially reducing the throughput or the like. Cleaning while loading the product wafer 1 in the plating cup 24 is advantageous, because it ensures smooth treatment flow.

The prior stirring step 90 of FIG. 17 is not essential but is effective for stabilizing the plating characteristics.

6. Summary

The invention made by the present inventors was so far described specifically based on the embodiment with the plating process for forming a gold bump as an example. It should however be borne in mind that the invention is not limited to or by it. It is needless to say that the invention includes various changes or modifications without departing from the gist of the invention.

For example, the invention can be applied similarly to the formation of a solder bump other than gold such as silver bump. It can be applied not only to the formation of a bump but also widely to handling of materials.

In the embodiment of the invention, a process of making an opening in a resist film and plating the opening was described. It is needless to say that the invention can be applied to a process, such as a copper damascene process (or silver damascene process) in which almost an entire wafer surface is plated with a metal film without using a resist film.

In the above-described embodiment, a plating apparatus was described specifically with a cup-inversion type (wafer face up type) plating apparatus facilitating securing high flatness as a main example, but the invention is not limited to it. It is needless to say that it can also be applied almost similarly to a wafer-face-down type plating apparatus which is used popularly at present without inverting a cup.

What is claimed is:

1. A manufacturing method of a semiconductor integrated circuit device comprising the steps of:
   (a) forming a resist film having a plurality of openings over a first main surface of a wafer;
   (b) introducing the wafer having the resist film into a single-wafer plating apparatus having a plating cup;
   (c) loading, in the single-wafer plating apparatus, the wafer having the resist film in the plating cup so as to place the wafer with the first main surface down and opposite to a plating tank of the plating cup;
   (d) after the step (c), introducing a plating solution into the plating tank with the first main surface of the wafer down;
   (e) after the step (d), stirring clockwise and anticlockwise the plating solution in the plating tank with the first main surface of the wafer down;
   (f) after step (e), inverting the plating cup;
   (g) after step (f), stirring clockwise and anticlockwise the plating solution in the plating tank with the first main surface of the wafer up;
   (h) after the step (g), forming a gold bump electrode with the first main surface of the wafer up by electroplating in the opening portions over the first main surface;
   (i) after step (h), re-inverting the plating cup; and
   (j) after step (i), unloading the wafer from the plating cup.

2. The manufacturing method of a semiconductor integrated circuit device according to claim 1, wherein the plating solution is a non-cyanide type.

3. The manufacturing method of a semiconductor integrated circuit device according to claim 2, wherein the step (e) is performed while filling the plating solution in the plating tank to such a level as to bring the plating solution into contact with the first main surface of the wafer.

4. The manufacturing method of a semiconductor integrated circuit device according to claim 3, wherein after the step (g), the step (h) is performed without discharging the plating solution.

5. The manufacturing method of a semiconductor integrated circuit device according to claim 1, wherein the step (h) is performed while filling the plating tank with the plating solution.

6. The manufacturing method of a semiconductor integrated circuit device according to claim 1, wherein the electroplating in the step (h) is performed using an anode electrode having iridium oxide as a main component.

7. The manufacturing method of a semiconductor integrated circuit device according to claim 1, wherein the step (h) comprises the substeps of:
   (h1) supplying a first electric current to the plating tank to perform electroplating; and
   (h2) after the substep (h1), supplying a second electric current greater than the first electric current to perform electroplating.

8. The manufacturing method of a semiconductor integrated circuit device according to claim 1, wherein the resist film of the step (a) is formed by the method of application.

9. The manufacturing method of a semiconductor integrated circuit device according to claim 1, wherein the steps (g) and (h) are carried out while circulating the plating solution by introducing the plating solution from a portion of the plating tank in the vicinity of the wafer and at the same time, discharging the plating solution from the bottom of the plating tank.

10. A manufacturing method of a semiconductor integrated circuit device, comprising the steps of:
   (a) forming a resist film having a plurality of openings over a first main surface of a wafer;
   (b) introducing the wafer having the resist film into a single-wafer plating apparatus having a plating cup;
   (c) loading, in the single-wafer plating apparatus, the wafer having the resist film in the plating cup so as to place the wafer with the first main surface down and opposite to a plating tank of the plating cup;
   (d) after the step (c), introducing a plating solution into the plating tank with the first main surface of the wafer down;
   (e) after the step (d), stirring clockwise and anticlockwise the plating solution in the plating tank with the first main surface of the wafer down;
   (f) after step (e), inverting the plating cup;
   (g) after the step (f), stirring clockwise and anticlockwise the plating solution in the plating tank with the first main surface of the wafer up;
   (h) forming a gold bump electrode by electroplating in the opening portions over the first main surface in the plating tank with the first main surface of the wafer up;
   (i) after step (h), re-inverting the plating cup;

(j) after the step (i), discharging the plating solution from the plating tank while re-inverting the plating cup with the first main surface of the wafer down; and (k) after the step (j) unloading the wafer from the plating cup, wherein the steps (e), (g), and (h) are performed while circulating the plating solution by introducing the plating solution from a portion of the plating cup in the vicinity of the wafer and, at the same time, discharging the plating solution from the bottom of the plating cup.

11. The manufacturing method of a semiconductor integrated circuit device according to claim 10, wherein the plating solution is introduced from a portion of the plating cup in the vicinity of the wafer and discharged from the bottom of the plating cup.

12. The manufacturing method of a semiconductor integrated circuit device according to claim 10, wherein the electroplating in the step (h) is performed using an anode electrode having iridium oxide as a main component.

13. The manufacturing method of a semiconductor integrated circuit device according to claim 10, wherein the step (h) comprises the substeps of:

(h1) supplying a first electric current to the plating tank to perform electroplating; and (h2) after the substep (h1), supplying a second electric current greater than the first electric current to perform electroplating.

* * * * *